United States Patent
McCurdy et al.

(10) Patent No.: US 6,774,741 B2
(45) Date of Patent: Aug. 10, 2004

(54) NON-UNIFORM TRANSMISSION LINE AND METHOD OF FABRICATING THE SAME

(75) Inventors: Michael W. McCurdy, Hendersonville, TN (US); David Murray, Hendersonville, TN (US); James M. Potter, Los Alamos, NM (US); Robert J. Sexton, Hendersonville, TN (US); Linda Sue Walling, Albuquerque, NM (US)

(73) Assignee: DeCorp Americas, Inc., Hendersonville, TN (US)

( * ) Notice: Subject to any disclaimer, the term of this patent is extended or adjusted under 35 U.S.C. 154(b) by 39 days.

(21) Appl. No.: 10/154,929

(22) Filed: May 28, 2002

(65) Prior Publication Data

US 2003/0222727 A1 Dec. 4, 2003

(51) Int. Cl.$^7$ ................................................. H01P 5/00
(52) U.S. Cl. ................................................ 333/1; 333/236
(58) Field of Search ............................. 333/1, 236, 238, 333/12, 34

(56) References Cited

U.S. PATENT DOCUMENTS

| | | | |
|---|---|---|---|
| 4,407,065 A | * 10/1983 | Gray | 29/828 |
| 4,441,088 A | 4/1984 | Anderson | |
| 4,992,059 A | 2/1991 | King et al. | |
| 5,373,109 A | 12/1994 | Argyrakis et al. | |
| 5,430,247 A | * 7/1995 | Bockelman | 174/33 |
| 5,939,952 A | * 8/1999 | Noda et al. | 333/1 |
| 6,005,193 A | 12/1999 | Markel | |
| 6,055,722 A | * 5/2000 | Tighe et al. | 29/843 |
| 6,162,992 A | 12/2000 | Clark et al. | |
| 6,225,568 B1 | 5/2001 | Lin et al. | |
| 6,271,472 B1 | 8/2001 | Mattos et al. | |
| 6,336,827 B1 | * 1/2002 | Akama et al. | 439/610 |

* cited by examiner

Primary Examiner—Michael Tokar
Assistant Examiner—Linh V Nguyen
(74) Attorney, Agent, or Firm—McGinn & Gibb, PLLC

(57) ABSTRACT

A non-uniform transmission line includes at least one patterned conductive layer, a dielectric layer adjacent to the patterned conductive layer(s), and an insulating layer surrounding the patterned conductive layer(s) and the dielectric layer.

52 Claims, 20 Drawing Sheets

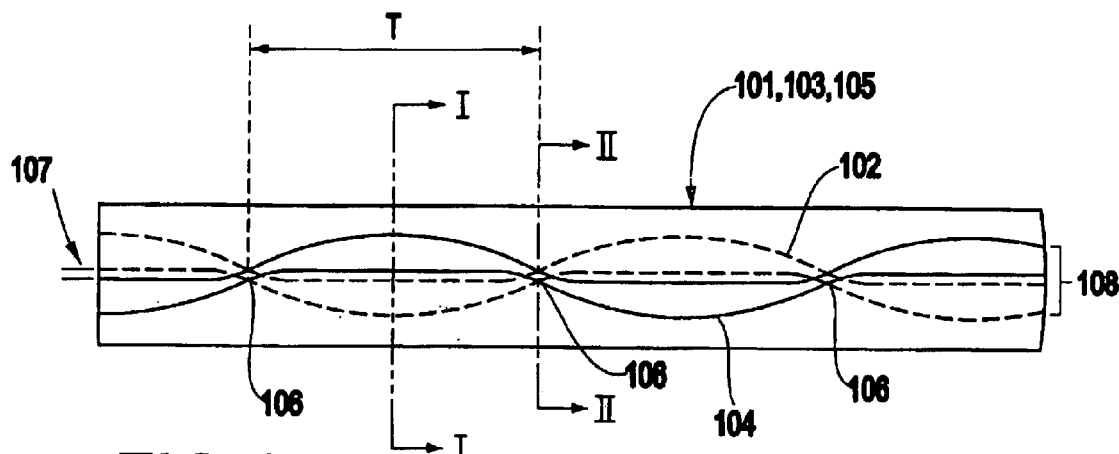
FIG.1A
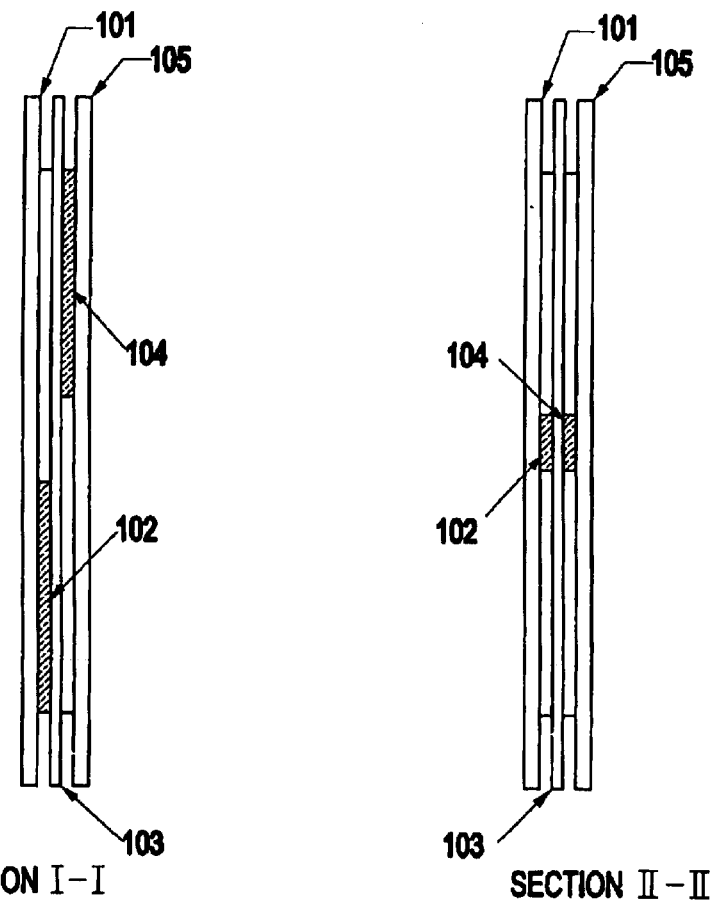
SECTION I-I
FIG.1B
SECTION II-II
FIG.1C

SECTION I-I

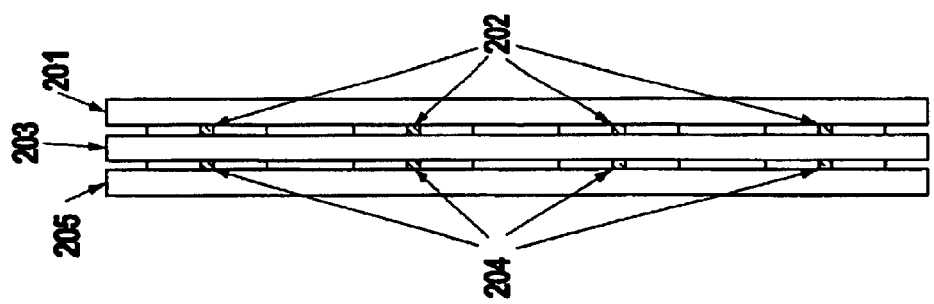
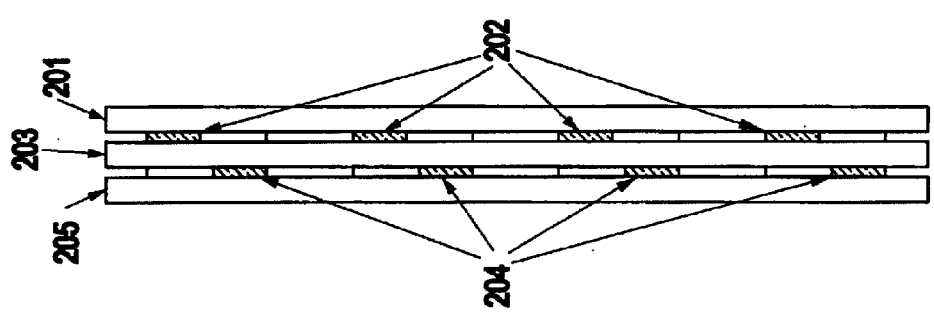
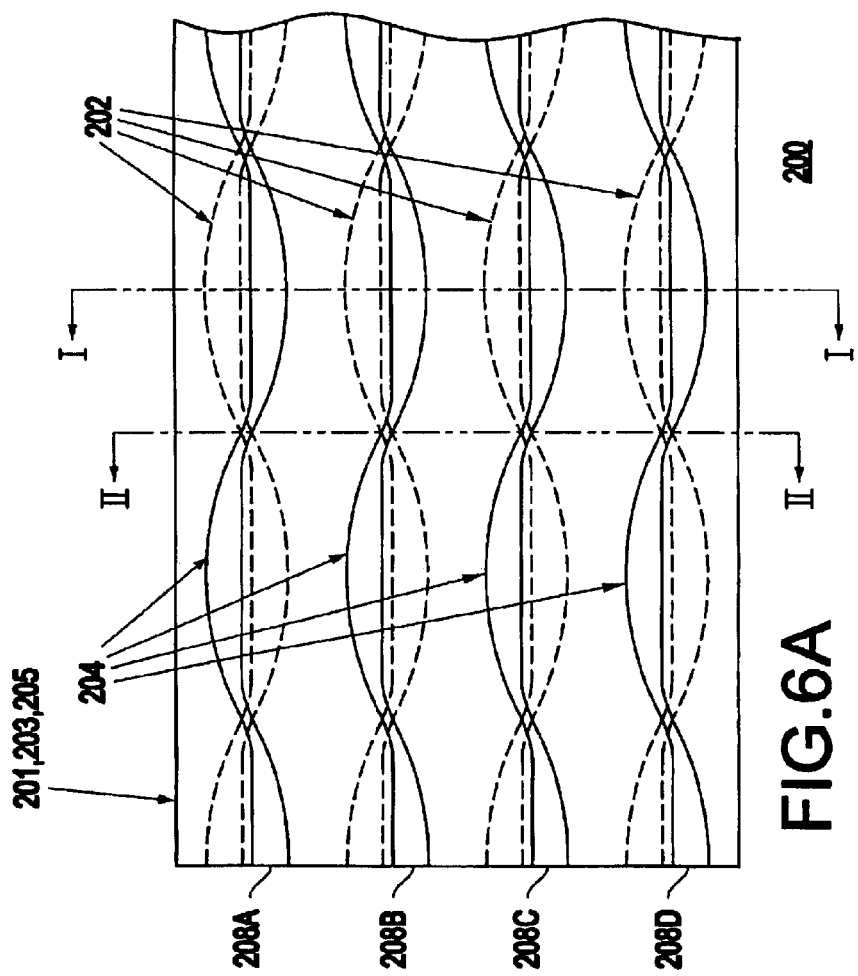

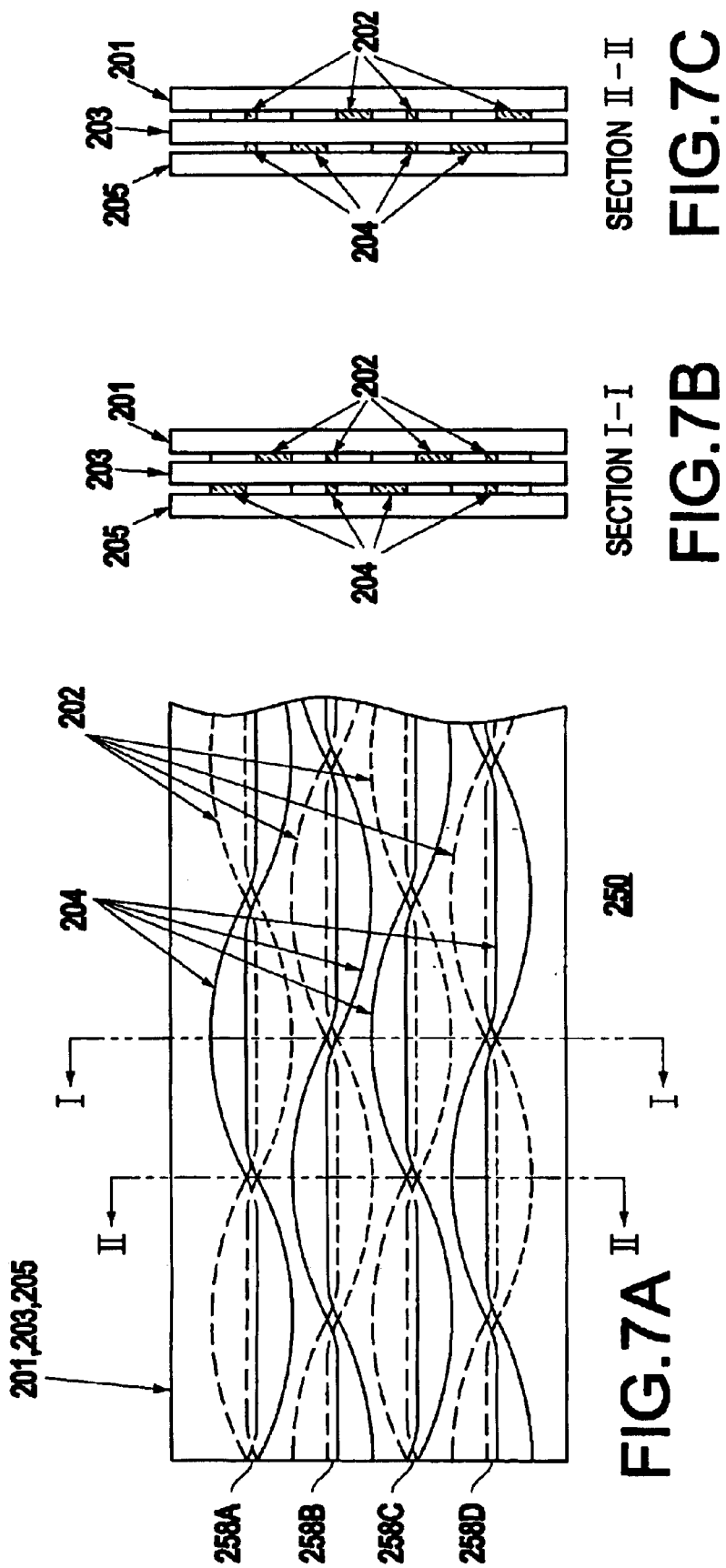

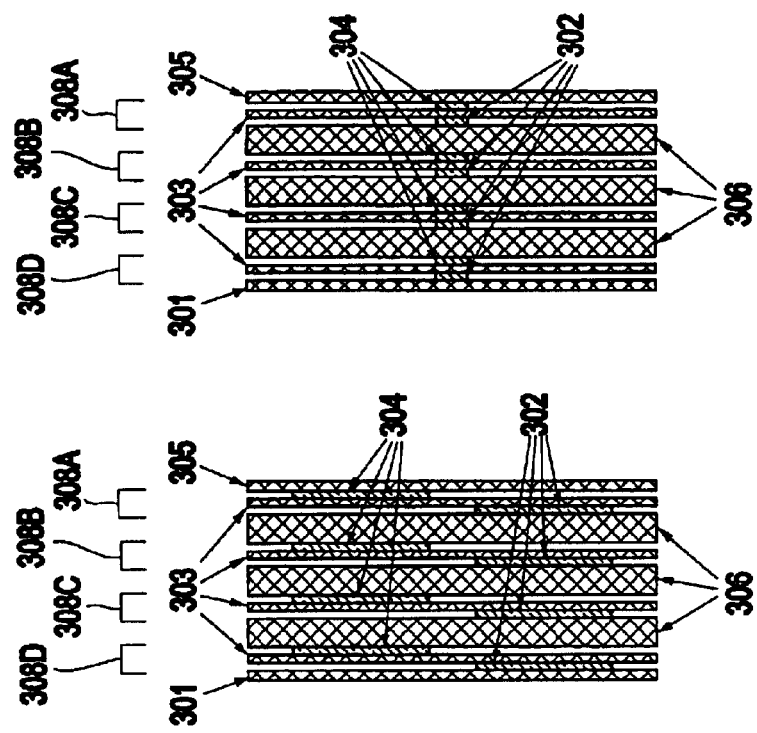
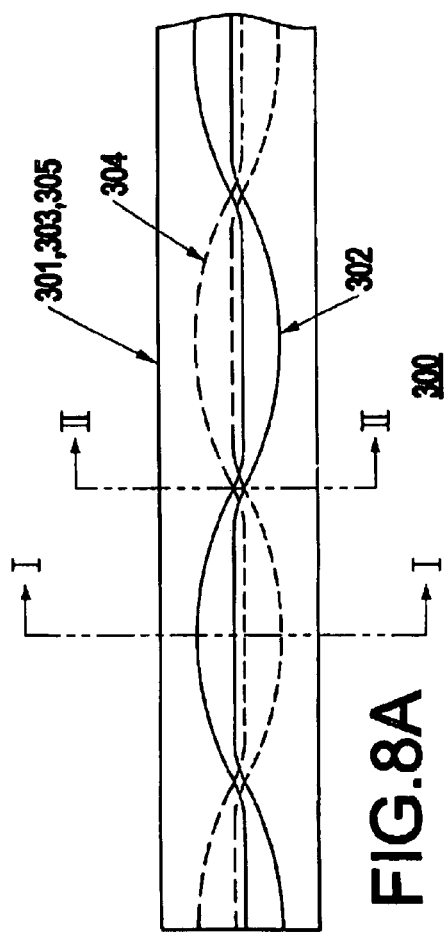
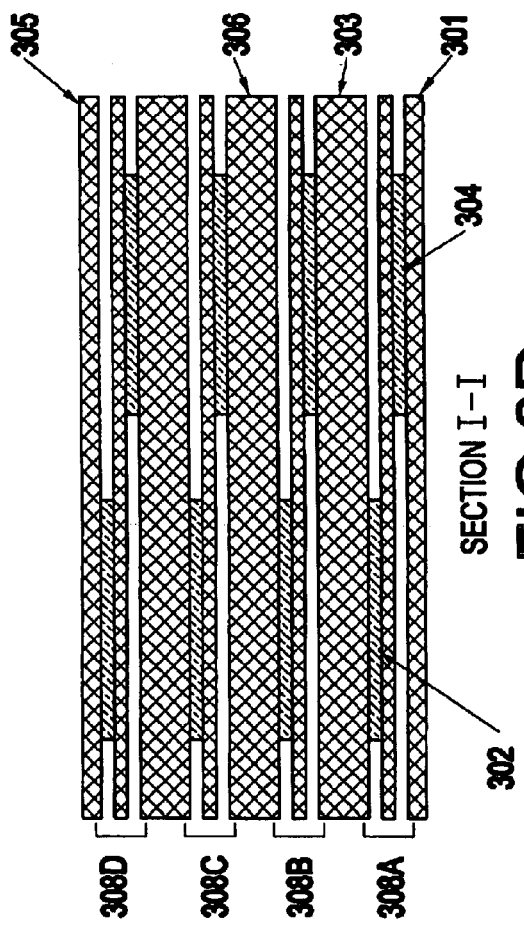
FIG.8A
FIG.8B SECTION I–I
FIG.8C SECTION II–II
FIG.8D SECTION I–I

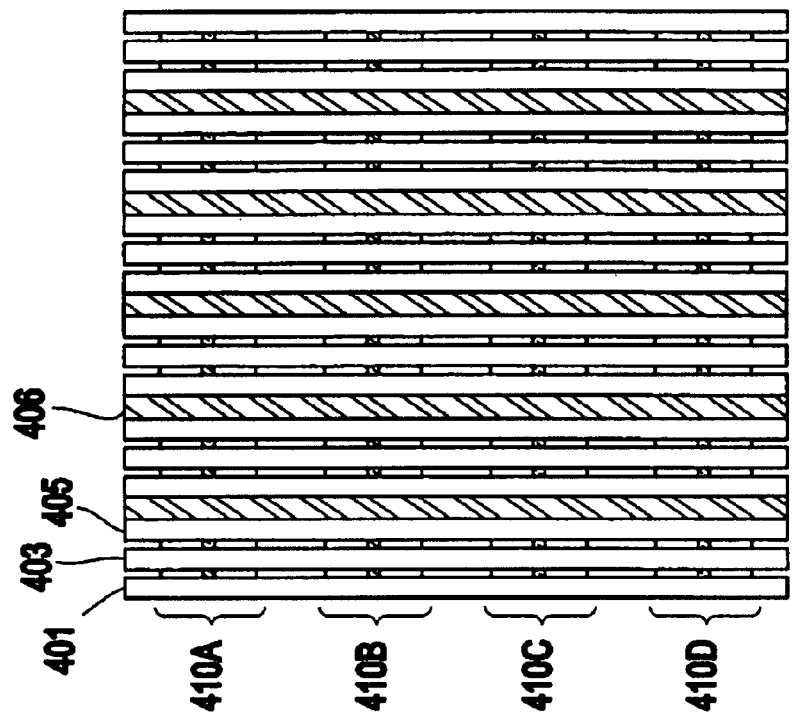
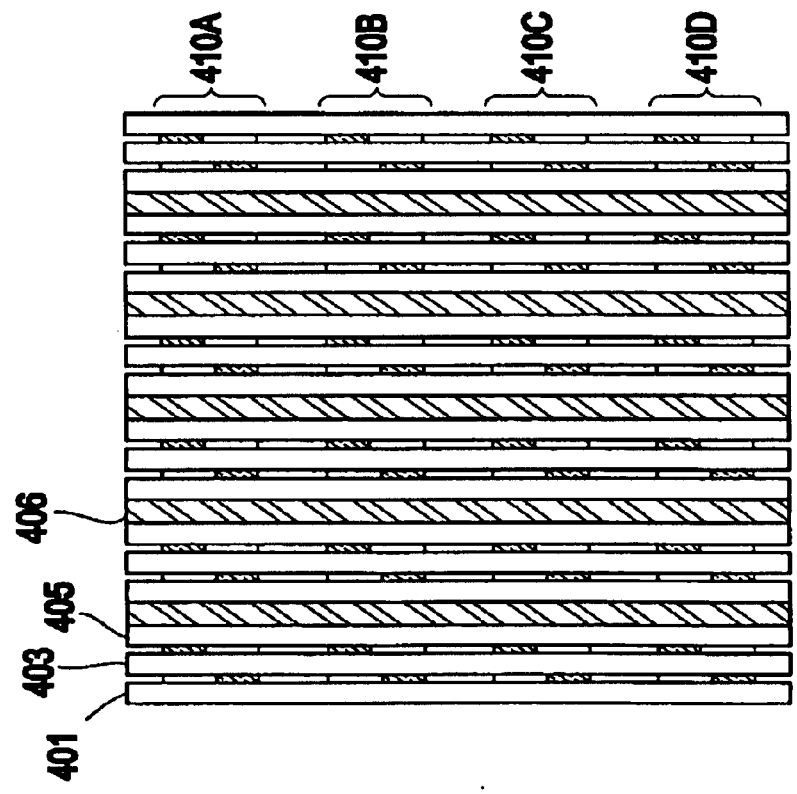

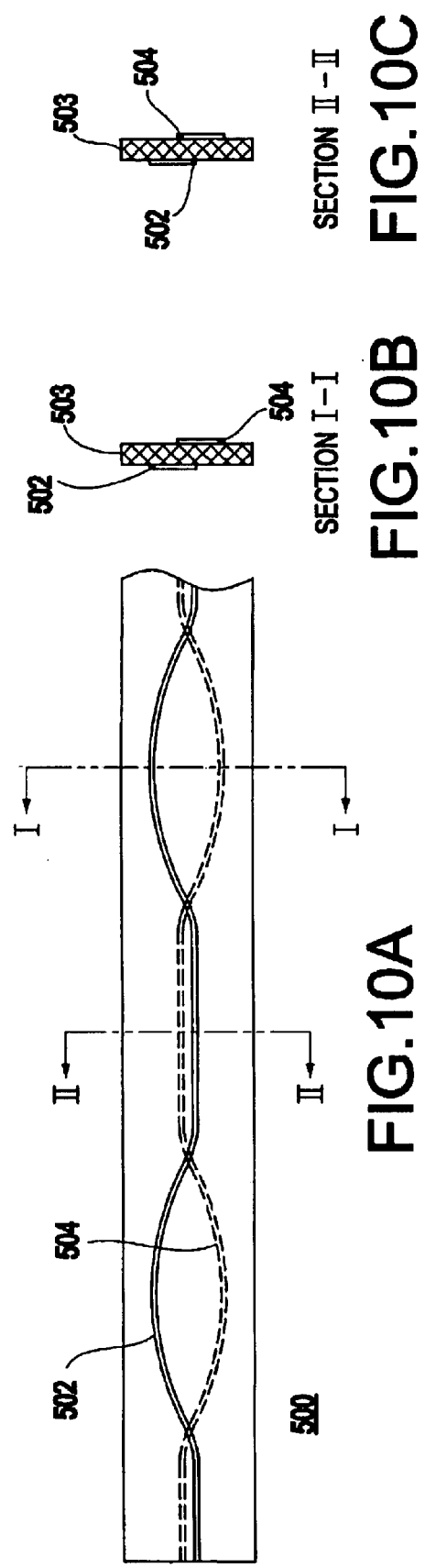

PAIR SPACING

VERTICAL SPACER

FIG. 13            Parameter Effects Matrix

| Parameter Increased | Impedance | Attenuation | High Frequency Limit | Cross Talk | Propagation Delay | Overall Signal Integrity |
|---|---|---|---|---|---|---|
| 1. Offset Distance | Increase | May increase or decrease depending on materials | Decrease | Increase | Increase | Decrease |
| 2. Capacitive Area | Decrease | Increase | Decrease | Decrease | Increase | Decrease |
| 3. Period Length | Increase | May increase or decrease depending on materials | Decrease | Increase | Increase | Decrease |
| 4. Dielectric Layer Thickness | Increase | May increase or decrease depending on materials | Increase | Increase | Decrease | May increase or decrease depending on other parameters |
| 5. Dielectric Layer Dielectric Constant | Decrease | May increase or decrease depending on materials | Decrease | Decrease | Increase | Decrease |
| 6. Dielectric Layer Dissipation Factor | Increase | Increase | Decrease | Decrease | Increase | Decrease |
| 7. Conductor Conductivity | N/A | Decrease | Increase | Decrease | N/A | Increase |
| 8. Pair Spacing | N/A | Decrease | Increase | Decrease | N/A | Increase |
| 9. Adjacent Period Length | N/A | May increase or decrease depending on other factors | May increase or decrease depending on other factors | May increase or decrease depending on other factors | N/A | May increase or decrease on other factors |
| 10. Vertical Spacer Thickness | Increase | Decrease | Increase | Decrease | N/A | Increase |
| 11. Covering Layer Dielectric Constant | Decrease | May increase or decrease depending on materials | Decrease | Decrease | Increase | Decrease |
| 12. Vertical Spacer Dielectric Constant | Decrease | May increase or decrease depending on materials | Decrease | Increase | Increase | Decrease |

NON-UNIFORM TRANSMISSION LINE AND METHOD OF FABRICATING THE SAME

BACKGROUND OF THE INVENTION

1. Field of the Invention

The present invention generally relates to a non-uniform transmission line, and more particularly to a non-uniform transmission line which may be used as a multi-purpose transmission line.

2. Description of the Related Art

Conventional uniform transmission lines are formed of conductors (e.g., round wires) which have a uniform cross sectional thickness (e.g., diameter) along the length of the line. In addition, the spacings between these uniform conductors are typically constant along the length of the transmission line. Indeed, even in a conventional line having twisted round wires the spacing between the conductors is constant along the length of the line.

The signal integrity of high speed electrical signals, such as digital signals or high bandwidth analog signals as they propagate along such conventional transmission media, is bounded by the electromagnetic characteristics of that cable or transmission media. To date, those characteristics are determined utilizing round wire (e.g., a uniform transmission line) with a defined insulation thickness twisted in a specified fashion and bundled with other wires similarly specified, or by utilizing a coaxial (e.g., two concentric conductors) construction geometry with an appropriate dielectric between the conductors. The characteristic impedance (common mode and differential mode) and its constituents (series resistance and inductance, and shunt capacitance and conductance), cross talk, delay, attenuation and a multiplicity of other parameters are all determined by this physical construction. Thus, these construction techniques limit the cable/transmission media performance, and consequently, put a limit on signal integrity performance.

Further, conventional metallic data wire configurations are trying to get beyond the 250 MHz per pair milestone proposed by the TIA/EIA Category 6 specification. Cable Television/Digital Signal coaxial cable is also limited in transmission capabilities due to its inherent properties and construction.

The maximum performance capabilities of both types of wire (conventional/CATV) are severely degraded in "real world" installations of the cables and the interconnect interfaces. Specifically, the manner in which cables and transmission lines are installed throughout a residential or commercial building's ceiling, floors and walls induces mechanical distortions with respect to as-manufactured conductor proximities. These physical distortions result in inconsistent electromagnetic properties, adversely affecting signal integrity.

Further, multiple connection interfaces are commonly found along any given signal path between a building's transmission line entry point to the final destination interconnects and ultimately to the device connection within that building. These multiple connection interfaces result in impedance mismatches causing farther signal degradation.

In addition, conventional wire connectors are made of a conductive material slightly conformed and placed within a close proximity utilizing various forms of fastening to create pressure for the desired effect of electrical connectivity and mechanical stability. These conventional connectors suffer from several problems including varying contact resistance upon installation, changing contact resistance over time, loss of signal, corrosion, difficulty of installation, and disconnection under various mechanical conditions.

The conductor of the transmission line (e.g., wire) also plays a major role in these connector problems due to its inherent structure and incompressibility. Either solid or stranded wire must be formed to properly fasten to a connector. Although it is formed in some fashion, wire still does not make good surface contact. To minimize this effect, users often resort to welding or soldering to make more surface contact available only to find that the next connection has contributed the same issue or even a worse problem, not to mention making the connection irreversible.

SUMMARY OF THE INVENTION

In view of the foregoing and other problems of the conventional techniques, an object of the present invention is to provide a non-uniform transmission line which may be used, for example, as a multipurpose transmission medium (e.g., voice/data wire). The applications for the inventive transmission line are virtually limitless but may include, for example, telecommunication systems and signal broadcasting systems. The inventive transmission line may also used, either alone or in combination with other transmission media, as part of an infrastructure (e.g., building) bus.

In a first aspect, the present invention includes a non-uniform transmission line which has at least one patterned conductive layer, a dielectric layer adjacent to the patterned conductive layer(s), and an insulating layer surrounding the patterned conductive layer(s) and the dielectric layer.

The dielectric layer may also be patterned and may have a thickness of about 0.00025 to 0.250 inches and a dielectric constant of 1 to 10. In addition, the dielectric layer may be formed of a polymer and may include a plurality of dielectric layers.

Further, the non-uniform transmission line may include a plurality of patterned conductive layers and a dielectric layer may be formed between each patterned conductive layer. For instance, the plurality of patterned conductive layers may have a multi-planar arrangement and include a first conductive layer in a first horizontal plane, and a second conductive layer in a second horizontal plane.

In addition, the non-uniform transmission line may be flexible. Moreover, when the non-uniform transmission line is flexed, a separation distance may be maintained between each patterned conductive layer.

Further, the patterned conductive layer may be electrically conductive and have a non-uniform pattern within a given period. A period may be defined as the shortest or smallest unique geometrical element or unit cell, that when repeated, makes up the non-uniform transmission line, or alternatively, the shortest non-zero distance, T, in any units, along the length of the non-uniform transmission line such that the cross-section at any arbitrary fixed point, x, along the line, and the cross-section at x+/−T (e.g., x plus or minus T) are identical. Further, each patterned conductive layer may be formed of a variety of electrically conductive materials and have a thickness of no more than about 0.1 inches.

In another aspect, the non-uniform transmission line includes at least one transmission group, each transmission group comprising at least one patterned conductive layer, a dielectric layer formed adjacent the patterned conductive layer(s), and an insulating layer covering the transmission group(s) and dielectric layer. Specifically, the each transmission group may include a plurality of patterned conductive layers with the dielectric layer formed between each patterned conductive layer.

Further, the inventive non-uniform transmission line may include a plurality of transmission groups. For example, the transmission groups may be coplanar, and the dielectric layer may be formed between patterned conductive layers of each transmission group.

In addition, the plurality of transmission groups may be in separate planes so as to form a multi-planar arrangement. In this case a separating insulating layer may be formed between each transmission group to reduce crosstalk between the transmission groups.

Further, the non-uniform transmission group may have a first transmission group with a period (e.g., crossover frequency) which is different from a period of a second transmission group. Further, the transmission groups may be arranged so that the periods of the transmission groups do not coincide. In other words, at one point in the line one transmission group may have a crossover node, whereas another transmission group at the same point in the line may not have a crossover node. Further, the transmission groups may have different applications.

Further, the non-uniform transmission line may include several layers of transmission groups. For instance, the non-uniform transmission line may include a first set of transmission groups, each transmission group having a first patterned conductive layer in a first horizontal plane and a second patterned conductive layer in a second horizontal plane, a second set of transmission groups, each transmission group having a first patterned conductive layer in a third horizontal plane and a second patterned conductive layer in a fourth horizontal plane, and a separating insulating layer formed between the first and second set of transmission groups. In this case, the same dielectric layer is formed between patterned conductive layers in the first set of transmission groups, and the same dielectric layer is formed between patterned conductive layers in the second set of transmission groups.

In addition, the non-uniform transmission line may include a single patterned conductive layer comprising first and second portions which are separated by a predetermined distance, and an insulating layer surrounding the patterned conductive layer. Specifically, the first and second portions may have, for example, interweaving or interlocking arrangement. Further, the patterned conductive layer may have a width of 0.25 inches or more.

In another aspect, a method of fabricating a non-uniform transmission line includes forming at least one patterned conductive layer, forming a dielectric layer adjacent (e.g., between) to each patterned conductive layer, and covering the patterned conductive layer(s) and dielectric layer with an insulating layer. For example, the patterned conductive layer may be formed by a stamping or forming process, etching process, screening process or molding process. Further, the patterned conductive layer may be formed by a laser cutting process, a wafer cutting process and a wafer splitting process.

In another aspect, a bundled transmission line may include at least one non-uniform transmission line which has at least one patterned conductive layer, a dielectric layer adjacent to the patterned conductive layer(s), and an insulating layer surrounding the patterned conductive layer(s) and the dielectric layer. The bundled transmission line may also include at least one uniform transmission line (e.g., round wire).

With its unique and novel features, the present invention provides a revolutionary, new and novel non-uniform transmission line which may be efficiently and effectively used as a high speed transmission medium in multiple and diverse applications.

BRIEF DESCRIPTION OF THE DRAWINGS

The foregoing and other objects, aspects and advantages will be better understood from the following detailed description of a preferred embodiment of the invention with reference to the drawings, in which:

FIG. 1A illustrates a top view of a non-uniform transmission line 100 according to the present invention;

FIG. 1B illustrates a view along cross-section I—I of a non-uniform transmission line 100 according to the present invention;

FIG. 1C illustrates a view along cross-section II—II of a non-uniform transmission line 100 according to the present invention;

FIG. 6A illustrates a top view of a non-uniform transmission line 200 according to a second aspect of the present invention;

FIG. 6B illustrates a view along cross-section I—I of a non-uniform transmission line 200 according to a second aspect of the present invention;

FIG. 6C illustrates a view along cross-section II—II of a non-uniform transmission line 200 according a second aspect of the present invention;

FIGS. 7A–7C illustrate a non-uniform transmission line 200 in which the patterned conductive layers of the transmission groups have periods which do not coincide;

FIGS. 8A–8D illustrate a third aspect of the non-uniform transmission line 200 in which the transmission groups are formed in separate horizontal planes;

FIGS. 9A–9C illustrate a fourth aspect of the non-uniform transmission line 200 having several layers of transmission groups so as to form a stacked arrangement;

FIGS. 10A–10C illustrate a non-uniform transmission line in which the conductive layers are other than flat;

FIG. 13 provides a parameter effects matrix which outlines how adjusting some design parameters may affect the performance of the inventive non-uniform transmission line.

DETAILED DESCRIPTION OF PREFERRED EMBODIMENTS OF THE INVENTION

Figure 1D:
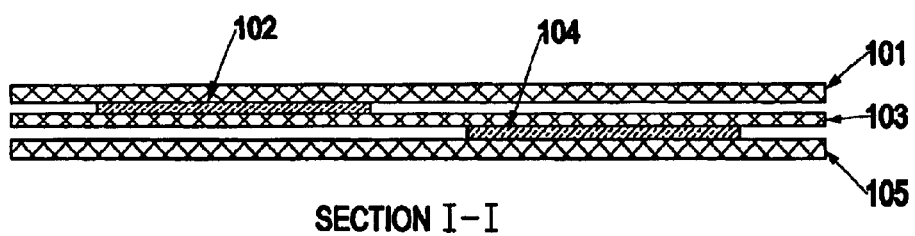
FIG. 1D provides a detailed illustration of the view along cross-section I—I of a non-uniform transmission line 100 according to the present invention.

Referring now to the drawings, FIGS. 1A–1D illustrate a non-uniform transmission line 100 according to a first aspect of the present invention.

The present invention implements a new electrically conductive non-uniform transmission medium and construction paradigm to expand existing signal integrity limitations. The inventive non-uniform transmission line may be very thin and may be used as a multipurpose transmission medium in a variety of applications including, for example, telecommunication systems and signal broadcasting systems.

As shown in FIG. 1A, the inventive non-uniform transmission line 100 includes at least one patterned conductive layer 102, 104. These conductive layer(s) may form a transmission group 108. The patterned conductive layers 102, 104 may be formed of a variety of materials and have a variety of patterns, dimensions and spacings. For example, the patterned conductive layers 102, 104 may be formed of an electrically conductive material such as metal (e.g., copper or silver), polysilicon, ceramic material, carbon fiber, or conductive ink. Further, the patterned conductive layers 102, 104 may be very thin. For instance, the is patterned conductive layers 104 may have a thickness of about 0.1 inches or less.

In addition, as shown in FIGS. 1A–1D, the patterned conductive layers 102, 104 may be formed in separate planes. Specifically, FIG. 1A shows patterned conductive layer 104 formed in a top horizontal plane and patterned conductive layer 102 formed in a bottom horizontal plane.

Unlike the conductors in a conventional uniform transmission line which have uniform dimensions along the length of the line and have a uniform spacing along the length of the line, the patterned conductive layers in the inventive non-uniform transmission line have a non-uniform feature (e.g., at least one non-uniform feature) along the length of the line. Specifically, the patterned conductive layers in the inventive non-uniform transmission line may have a dimension (e.g., width, thickness, etc.) that varies along the length of the line, and/or the patterned conductive layers may have a spacing which is not uniform (e.g., not constant) along the length of the line.

FIG. 1A illustrates a non-uniform transmission line 100 having patterned conductive layers 102, 104 which have varying widths and spacing along the length of the line. For instance, the width of the patterned conductive layers 102, 104 is larger at cross section I—I than at cross section II—II. In addition, the spacing between the patterned conductive layers 102, 104 is larger at cross section I—I than at cross section II—II.

It should be noted that the spacing between the patterned conductive layers 102, 104 may have a horizontal element and a vertical element. For instance, as shown in FIG. 1A, there may be a horizontal spacing 107 between the layers. This spacing is commonly referred to as an offset distance. In addition, as shown in FIGS. 1B–1D, there may be a vertical spacing between the layers, which may be considered to be the thickness of the dielectric layer 103 separating the layers 102, 104.

Further, as shown in FIGS. 1A–1D, the horizontal spacing (e.g., offset distance) between the patterned conductive layers 102, 104 may vary in the form of a cycle (e.g., a periodic arrangement). In other words, the spacing between the patterned conductive layers may have regularly recurring values over the length of the non-uniform transmission line. For instance, FIG. 1A shows the patterned conductive layer 102 crossing over the patterned conductive layer 104 at points 106 (e.g., crossover nodes 106) along the length of the line 100. For example, the period of this spacing arrangement may be given by the distance, T, between the crossover points 106. Alternatively, the pattern may be described in terms of a crossover frequency (e.g., the amount of crossover points per unit length) for the patterned conductive layer.

In other words, the non-uniform transmission line may possess a period which may be defined as the shortest or smallest unique geometrical element or unit cell, that when repeated, makes up the non-uniform transmission line, or alternatively, the shortest non-zero distance, T, in any units, along the length of the non-uniform transmission line such that the cross-section at any arbitrary fixed point, x, along the line, and the cross-section at x+/−T (e.g., x plus or minus T) are identical.

Further, the period may be non-uniform (e.g., not constant) over the length of the non-uniform transmission line 100. For instance, over a first portion of the length of the non-uniform transmission line 100, the spacing period may be more or less than the spacing period over a second portion of the length of the line. In other words, the distance between first and second crossover nodes, may be more or less than a distance between the second and third crossover nodes, and so forth. Further, the periodicity of the non-uniform transmission line may be selected so as to provide a desired electromagnetic characteristic for the non-uniform transmission line 100.

Further, the patterned conductive layers 102, 104 may be formed in a variety of patterns. For example, as shown in FIG. 1A, the conductive layers 102, 104 may have a wave-shaped pattern.

Further, as shown in FIGS. 1A–1D, a dielectric layer 103 may be formed adjacent to (e.g., between) each patterned conductive layer. This dielectric layer 103 in the inventive conductor 100 may be formed of a variety of materials. For example, the dielectric layer 103 may include a polymeric material (e.g., polypropylene film, polyester film, polyethylene film, etc.). Further, the dielectric layer 103 may have a thickness, for example, in a range of 0.00025 to 0.250 inches. In addition, a plurality of dielectric layers 103 may be formed between the patterned conductive layers 102, 104.

Further, the dielectric layer 103 may have a broad range of dielectric constants. For example, the dielectric layer 103 may have a dielectric constant in a range of 1 to 10. The dielectric layer 103 may also be patterned to affect a shape of the dielectric layer 103. For instance, the dielectric layer 103 may have a characteristic (e.g., thickness) which is non-uniform (e.g., not constant) over the length of the non-uniform transmission line 100. Further, the characteristics of the dielectric layer 103 (e.g., material, thickness, pattern, etc.) may be selected so as to provide a desired electromagnetic characteristic of the non-uniform transmission line 100. The dielectric layer may also have a dissipation factor from 0.1 to 0.000001.

As shown in FIGS. 1B–1D, the inventive non-uniform transmission line 100 also includes an insulating layer 101, 105 which covers the patterned conductive layers 102, 104 and dielectric layer 103. The insulating layer 101, 105, like the dielectric layer 103, may have a broad range of thicknesses and may be formed of a variety of materials. For instance, the insulating layer 101, 105 may be formed of a conventional insulating material (e.g.,.polypropylene, polyester, polyethylene, etc.). The insulating layer 101, 105 may also be patterned. For instance, the insulating layer 101, 105 may have a characteristic (e.g., thickness) which is non-uniform (e.g., not constant) over the length of the non-uniform transmission line 100.

It should be noted that the drawings (e.g., FIGS. 1B–1D) may show the insulating layers 101, 105 separated at the lateral sides of the non-uniform transmission line 100 (e.g., top and bottom of FIGS. 1B–1D). However, this is merely for illustrative purposes. In actuality, the insulating layers 101, 105 at the lateral sides of the non-uniform transmission line 100 may be bonded together (along with the dielectric layer 103, when applicable), for example, by plastic weldment or a bonding adhesive.

In addition, the sidewalls of the insulating layer 101, 105 may be tapered to allow the inventive non-uniform transmission line 100 to easily blend in with a surface on which the line is mounted. Such tapering, for example, may help to allow the non-uniform transmission line 100 to be practically unnoticeable when adhered to a wall and painted over or wallpapered over.

Further, the characteristics of the insulating layer 101, 105 may vary depending upon the application. For example, the material and thickness of the insulating layer 101, 105 may be selected depending upon the types of signals being transmitted by the inventive non-uniform transmission line 100, and depending upon the environment in which the non-uniform transmission line 100 is intended to be used.

Figure 1E:
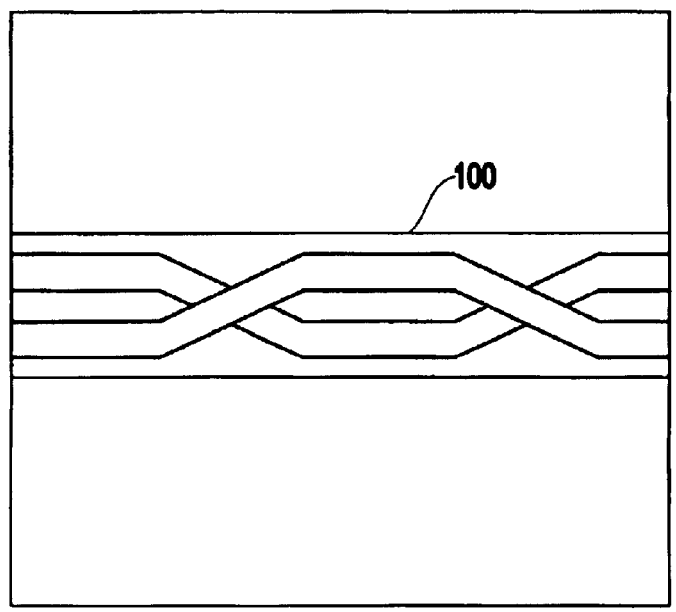
FIGS. 1E–1H illustrates views along different axes of the non-uniform transmission line 100 according to the present invention.
Figure 1F:
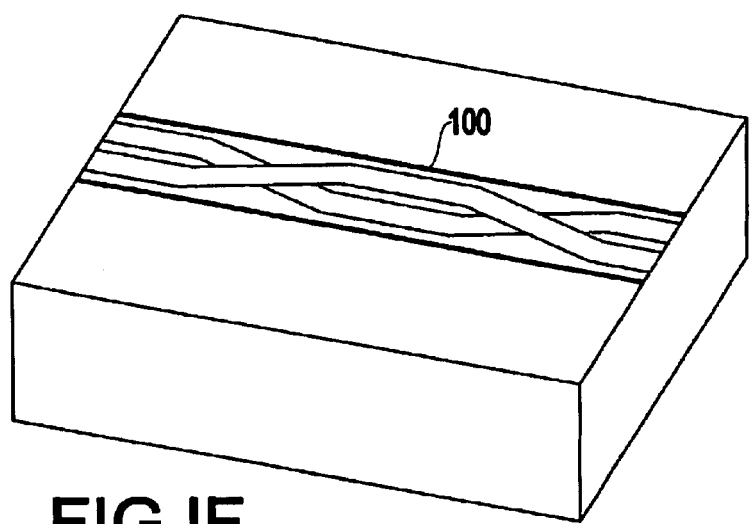
Figure 1G:
Figure 1H:
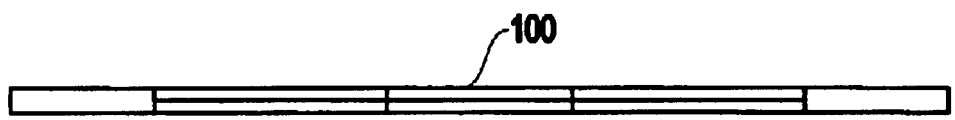

Further, FIGS. 1E–1H illustrate different views of the inventive non-uniform transmission line 100. For instance, FIG. 1E shows a view of the non-uniform transmission line from the Z-axis (e.g., a top view). FIG. 1F shows a three dimensional view of the non-uniform transmission line. Further, FIGS. 1G and 1H show a view of the non-transmission line from the X-axis and the Y-axis, respectively.

Figure 2:
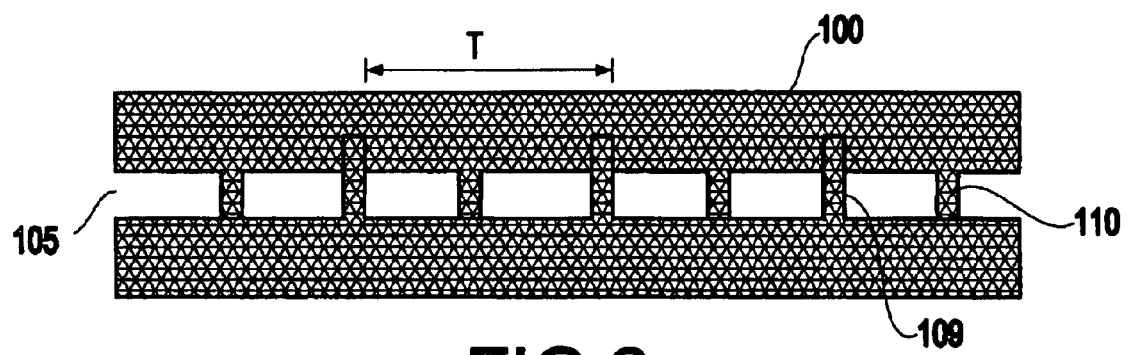
FIG. 2 illustrates the non-uniform transmission line 100 in which patterned conductive layers have extending portions.

FIG. 2 provides an example of another pattern shape of the conductive layer which may be used in the inventive non-uniform transmission line 100. As shown in FIG. 2 the conductive layers 102, 104 may be formed in separate horizontal planes and separated by a dielectric layer 103. Further, the conductive layers each have a pattern which includes an extending portion 109, 110 which occurs periodically over the length of line 100 and extends over/under the other conductive layer. For instance, in FIG. 2, the non-uniform transmission line 100 has a period, T.

Specifically, the extending portions 109, 110 may provide a function which is similar to the crossover point in the inventive non-uniform transmission line 100 shown in FIG. 1A. For instance, the extending portions 109, 110, like the crossover point, may help to provide a coupling (e.g., capacitive coupling) between the layers 102, 104 periodically down the length of the non-uniform transmission line.

Further, FIGS. 3A–3C, 4A–4C, and 5A–5C illustrate how the extending portions 109, 110 of the patterned conductive layers may help maintain electromagnetic properties, for example, when the spacing between the conductive layers is increased or decreased.

Figure 3A:
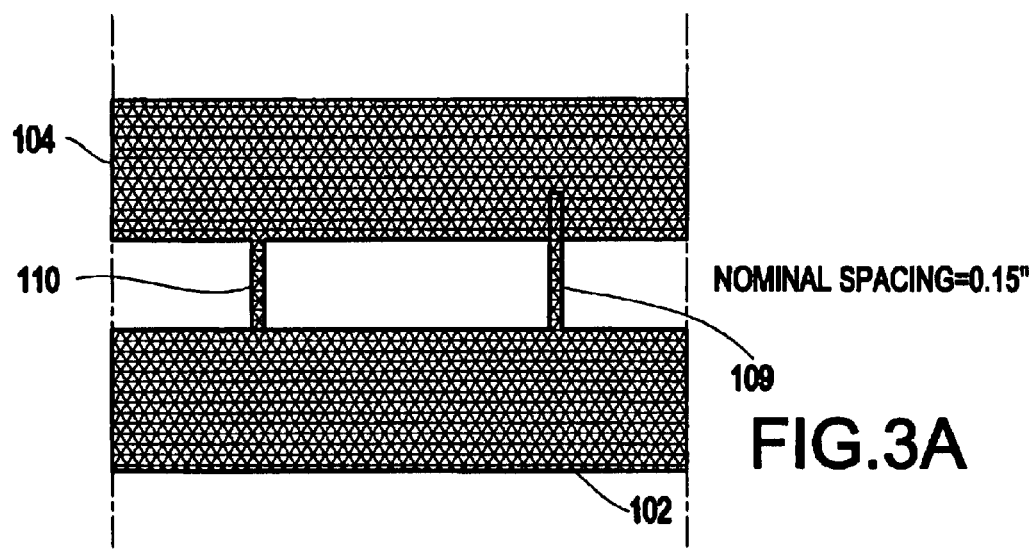
FIGS. 3A–3C, 4A–4C, and 5A–5C illustrate examples of non-uniform transmission lines having patterned conductive layers with extending portions.
Figure 3B:
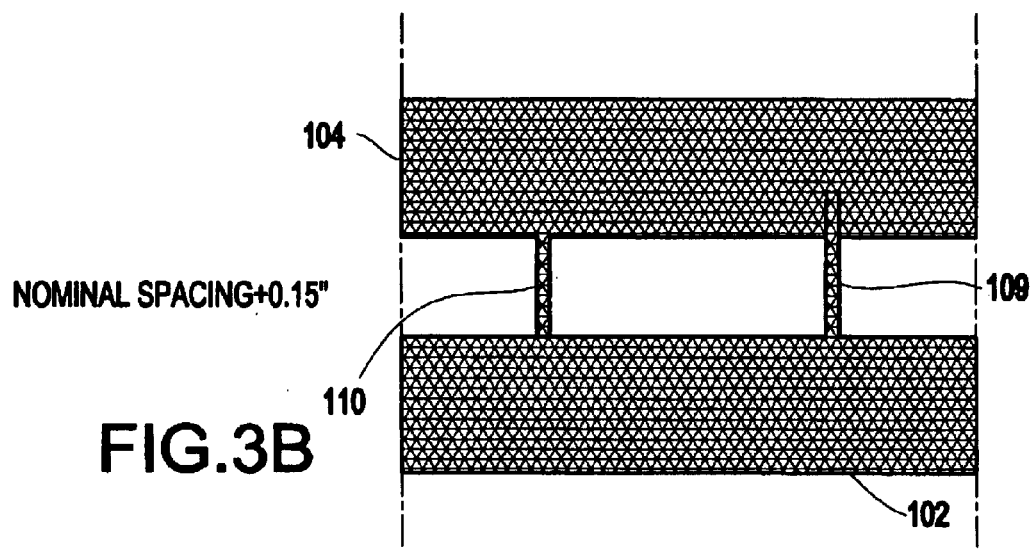
Figure 3C:
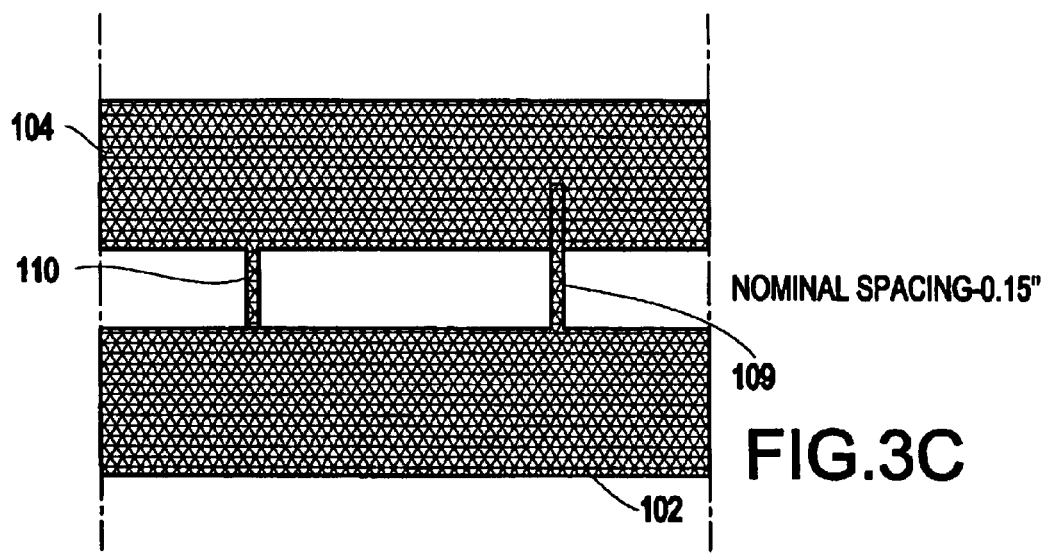

For instance, in the non-uniform transmission line 100 illustrated in FIGS. 3A–3C conductive layer 102 has an extending portion 109 which extends over conductive layer 104, and the extending portion 110 of conductive layer 104 extends under conductive layer 102. Specifically, in FIGS. 3A–3C, the extending portions 109, 110 have a rectangular (or square) shaped portion which extends over/under the other conductive layer. Further, a substantial portion of the extended portion of a patterned conductive layer should remain over/under the other patterned conductive layer when the spacing between the patterned conductive layers becomes more or less than a design (e.g., an original design). This may occur, for example, when the conductive layers become separated or pushed together such as by an environmental stress (e.g., bending and routing).

Specifically, FIG. 3A shows conductive layers 102, 104 having a design (e.g., an original design) in which the nominal spacing between the conductive layers 102, 104 is 0.15 inches, and in FIGS. 3B–3C the nominal spacing between the conductive layers 102, 104 has been increased by 0.015 inches and decreased by 0.015 inches, respectively. However, as explained above, where the distance between the conductive layers is increased or decreased, a substantial portion (e.g., surface area) of the extending portions 109, 110 remains over/under the other conductive layer. Therefore, the electromagnetic properties (e.g, capacitive coupling) of the conductive layers 102, 104 is maintained.

Figure 4A:
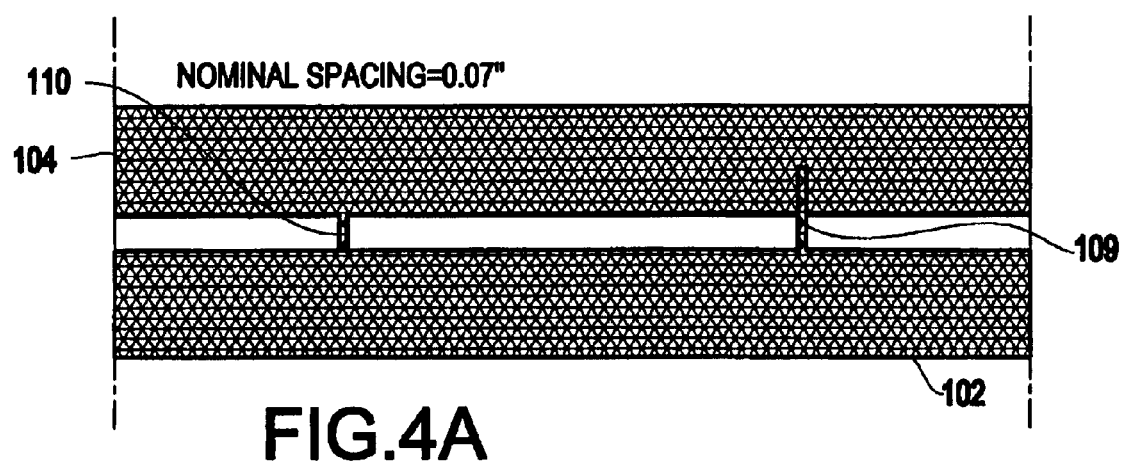
Figure 4B:
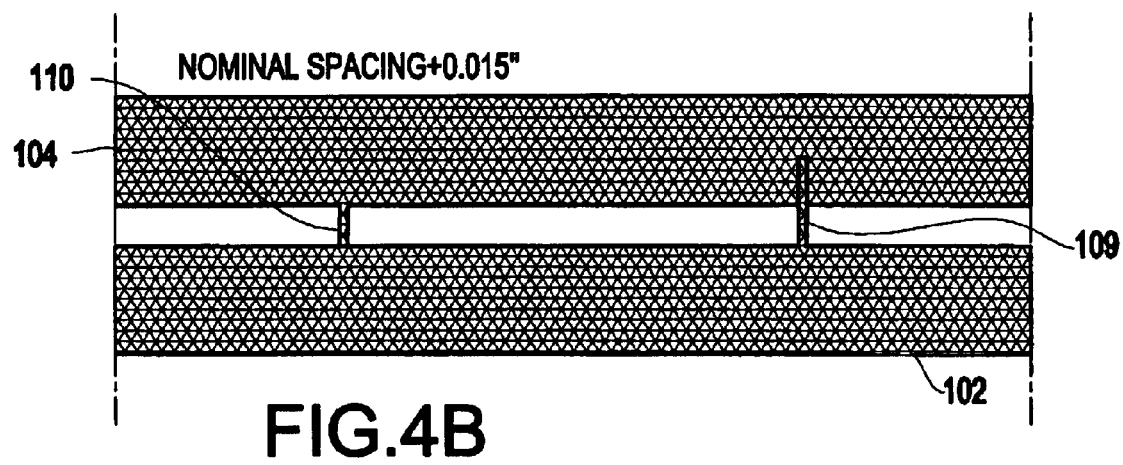
Figure 4C:
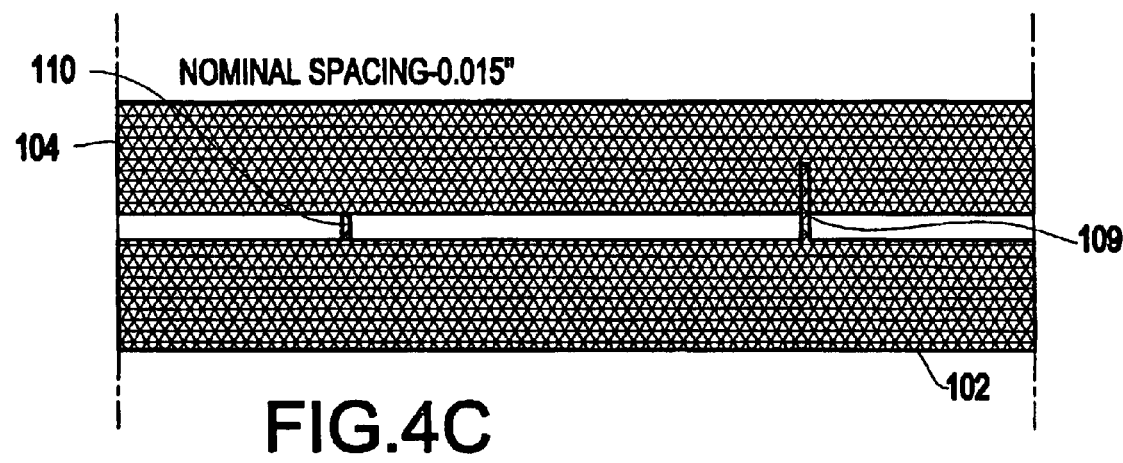

FIGS. 4A–4C show a non-uniform transmission line 100 similar to that shown in FIGS. 3A–3C. However, in FIG. 4A the nominal spacing between the conductive layers 102, 104 is 0.07 inches, and in FIGS. 4B–4C the nominal spacing between the conductive layers 102, 104 has been increased by 0.015 inches and decreased by 0.015 inches, respectively. However, as explained above, where the distance between the conductive layers is increased or decreased, a substantial portion (e.g., surface area) of the extending portions 109, 110 remains over/under the other conductive layer. Therefore, the electromagnetic properties (e.g, capacitive coupling) of the conductive layers 102, 104 is maintained.

Figure 5A:
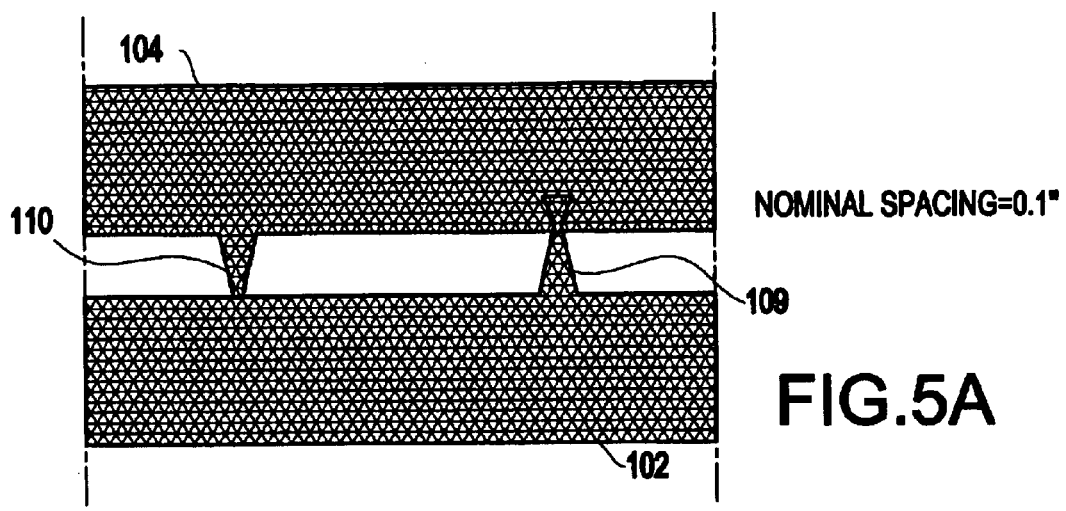
Figure 5B:
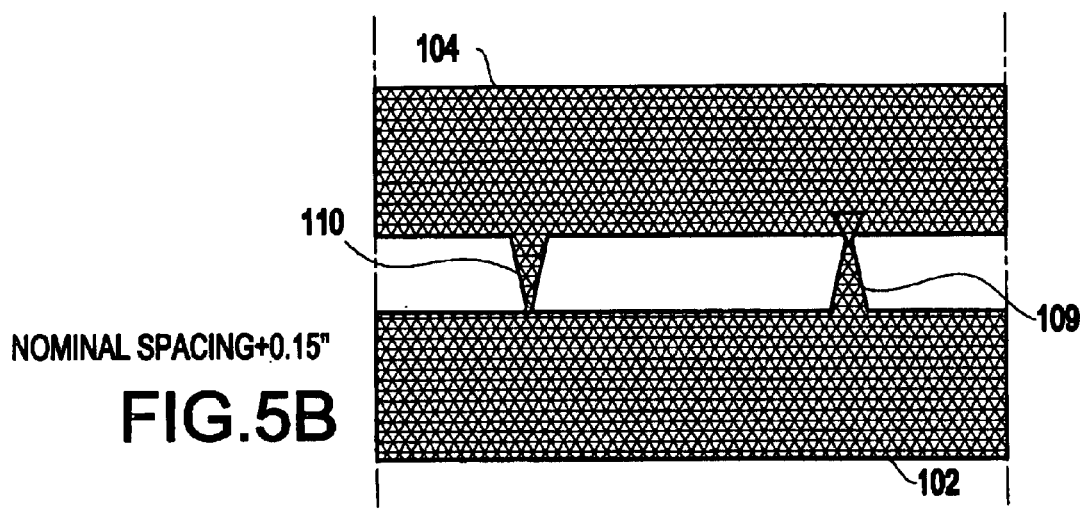
Figure 5C:
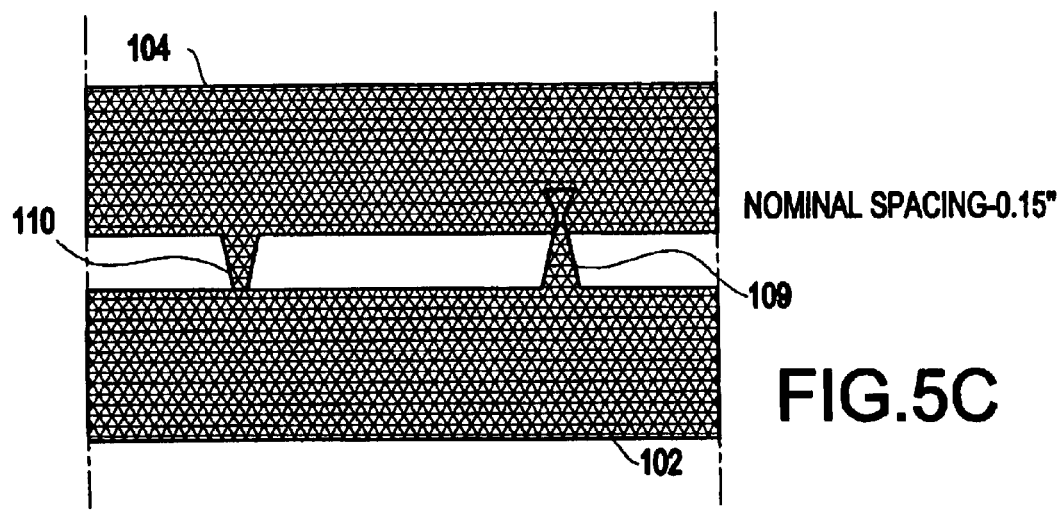

Further, in the non-uniform transmission line 110 shown in FIGS. 5A–5C the portion of the extending portions 109, 110 which extend over/under the other conductive layer has a triangular shape. This triangular shape may be helpful for maintaining a capacitive coupling of the conductive layers in the event that the spacing between the patterned conductive layers 102, 104 is increased or decreased. For instance, FIG. 5A shows conductive layers 102, 104 having a design (e.g., original design) in which the nominal spacing between the conductive layers 102, 104 is 0.1 inches, and in FIGS. 5B–5C the nominal spacing between the conductive layers 102, 104 has been increased by 0.015 inches and decreased by 0.015 inches, respectively. However, as shown in FIGS. 5B–5C, where the distance between the conductive layers is increased or decreased, a substantial portion of the extending portions 109, 110 remains over/under the other conductive layer. Therefore, the electromagnetic properties (e.g, capacitive coupling) of the conductive layers 102, 104 are maintained.

However, Applicant notes that the patterns discussed above are merely examples and should not be considered as limiting for purposes of this application. Further, the term "patterned" is not intended to limit the method of forming the conductive layers in any manner, but is merely intended to refer to a shape or spacing of the conductive layers. Further, the characteristics of the patterned conductive layer (e.g., material, width, thickness, pattern, etc.) in addition to the spacing between the patterned conductive layers, may be selected so as to provide a desired electromagnetic characteristic of the non-uniform transmission line 100.

An important feature of the inventive non-uniform transmission line, is that it may control and maintain the geometrical relationship between patterned conductive layers in the "real world" environment of bending and routing. Specifically, the patterned conductive layers and dielectric layers may be designed (e.g., materials, thickness, pattern, etc.) so as to maintain a geometrical relationship. In other words, the characteristics of the non-uniform transmission line (e.g., materials, patterns thicknesses, etc.) may be selected so that bending and flexing of the non-uniform transmission line does not alter the geometrical relationships of the constituent parts.

The inventive non-uniform transmission line may also be formed as part of a larger package for mechanical robustness. For instance, a sheath or the like may be used to bundle a plurality of non-uniform transmission lines.

Further, the inventive non-uniform transmission line may be used to connect to existing (e.g., conventional) interconnect devices via unique adapters. This would allow conventional devices to connect to the non-uniform transmission line without modification.

Further, the inventive non-uniform transmission line may provide a highly efficient transmission medium. For example, the inventive non-uniform transmission line may have a low impedance. On the other hand, the transmission efficiency can be easily controlled by controlling physical characteristic (e.g., pattern, offset distance, dielectric thickness) of the transmission line to provide a less than 100% efficient transmission, so that the non-uniform transmission line may act as a periodic leaky emitter (e.g., distributing signals uniformly along its length). Conversely, the emittance may be sectioned periodically along the length of the line.

In addition, the inventive non-uniform transmission line may have a high Is noise immunity (e.g., a high signal to noise ratio). Further, the noise immunity may be adjusted by adjusting the characteristics (e.g., pattern of the patterned conductive layers) of the non-uniform transmission line.

Figure 6D:
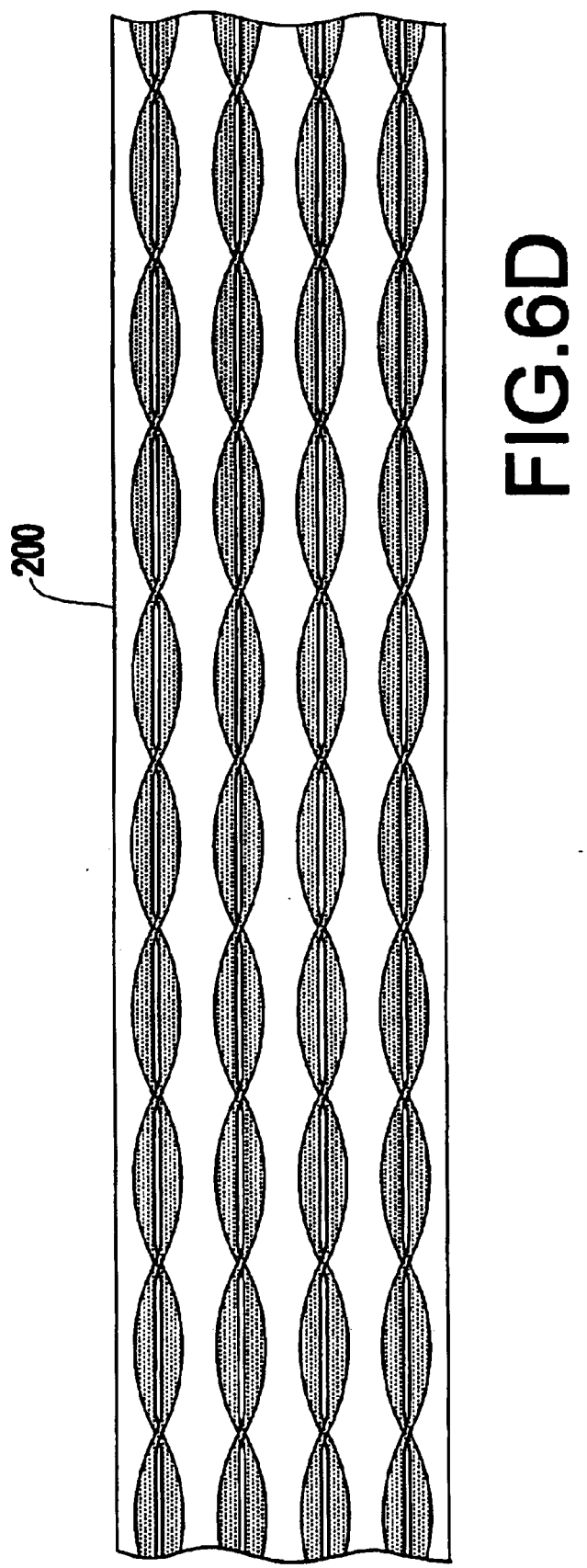
FIG. 6D illustrates a top view of a non-uniform transmission line 200 along a length of said non-uniform transmission line 200.

Referring again to the drawings, FIGS. 6A–6D illustrate a second aspect of a non-uniform transmission line 200 according to the present invention. As shown in FIG. 6A, the non-uniform transmission line 200 may have at least one (e.g., a plurality) transmission group 208A–208D, each of which includes at least one (e.g., a plurality) patterned conductive layer 202, 204.

Specifically, FIG. 6A illustrates a top view of the non-uniform transmission line 200, FIG. 6B illustrates a view along cross-section I—I of the non-uniform transmission line 200, and FIG. 6C illustrates a view along cross-section II—II of the non-uniform transmission line 200. Further, FIG. 6D illustrates a top view of a length of the non-uniform transmission line 200.

As shown in FIG. 6A, the transmission groups 205A–D may be parallel and coplanar. In other words, the first conductive layer 202 of each of the transmission groups 208A–D may be in the same horizontal plane, and the second conductive layer 204 of each of the transmission groups 208A–D may be in a different horizontal plane. Therefore, the same (e.g., continuous) dielectric layer 203 may be formed between the first conductive layer 202 and second conductive layer 204 in each of the transmission groups 205A–D.

Although FIGS. 6A–6D show the non-uniform transmission line 200 having four transmission groups 208A–D, this is certainly not intended to be limiting. In other words, the non-uniform transmission line 200 may include any range of transmission groups. For instance, the number of transmission groups may vary depending upon the application of the non-uniform transmission line 200.

Moreover, each of the transmission groups 208A–D in the non-uniform transmission line 200 may be used for different applications. For instance, transmission group 208A may be used as a voice/data wire, transmission group 208B may be used as a cable television wire, and so on.

In other words, transmission groups having different applications may be bundled in the same non-uniform transmission line so that the inventive non-uniform transmission line may include, for example, a voice/data wire, cable television wire, etc. formed in a single inventive non-uniform transmission line. The inventive non-uniform transmission line may, therefore, provide a household, office or building bus which is capable, for example, of transmitting data signals, broadcast signals, etc. for multiple applications.

Further, the transmission groups 208A–D may have different properties (e.g., patterns). For example, transmission group 208A may have a crossover frequency or offset distance that is different from transmission group 208B.

In addition, the transmission groups 208A–D may have different properties (e.g., patterns). For example, transmission group 208A may have a period (e.g., crossover frequency) or offset distance that is different from transmission group 208B. Specifically, the period of the patterned conductive layers 202, 204 in one transmission group may be different from the period of the patterned conductive layers 202, 204 in another transmission group, in order to reduce crosstalk between the transmission groups.

Further, as shown in FIGS. 7A–7C, a non-uniform transmission line 250 may include transmission groups 258A–D which have a same period, but which have patterned conductive layers 202, 204 which have features which do not coincide. In other words, at one point along the length of the non-uniform transmission line 250, one transmission group may have a crossover node, whereas another group may not have a crossover node. This may help to prevent crosstalk between transmission groups in the non-uniform transmission line.

Referring again to the drawings, FIGS. 8A–8D illustrate a non-uniform transmission line 300 according to a third aspect of the present invention. In this aspect, inventive non-uniform transmission line 300 includes a plurality of transmission groups (e.g., each transmission group having a first patterned conductive layer 302 and a second patterned conductive layer 304) formed as a stack (e.g., the transmission groups are formed in separate horizontal planes).

More specifically, FIG. 8A illustrates a top view of the non-uniform transmission line 300, FIG. 8B illustrates a view along cross-section I—I of the non-uniform transmission line 300, and FIG. 8C illustrates a view along cross-section II—II of the non-uniform transmission line 300. Further, FIG. 8D provides a detailed view of the cross-section I—I of the uniform transmission line 300.

As shown in FIGS. 8B–8D, in this aspect, the inventive non-uniform transmission line 300 includes dielectric layer (s) 303 formed the first patterned conductive layer 302 and second patterned conductive layer 304. The non-uniform transmission line 300 also includes a separating insulation layer (e.g., vertical spacer) 306 between each of the transmission groups 308A–D. The separating insulating layer 306 may be formed of materials similar to that of the insulating layer 301, 305 and may have a range of thicknesses. The separating layer 306 may help to inhibit cross talk between the transmission groups in different horizontal planes.

Further, as in the second aspect of the present invention, the transmission groups 305A–D (e.g., see FIGS. 8B–8C) in the inventive non-uniform transmission line 300 may have a different applications. For example, transmission group 308A may be used as a voice/data wire, transmission group 308B may be used as a cable television wire, and so on.

Figure 9A:
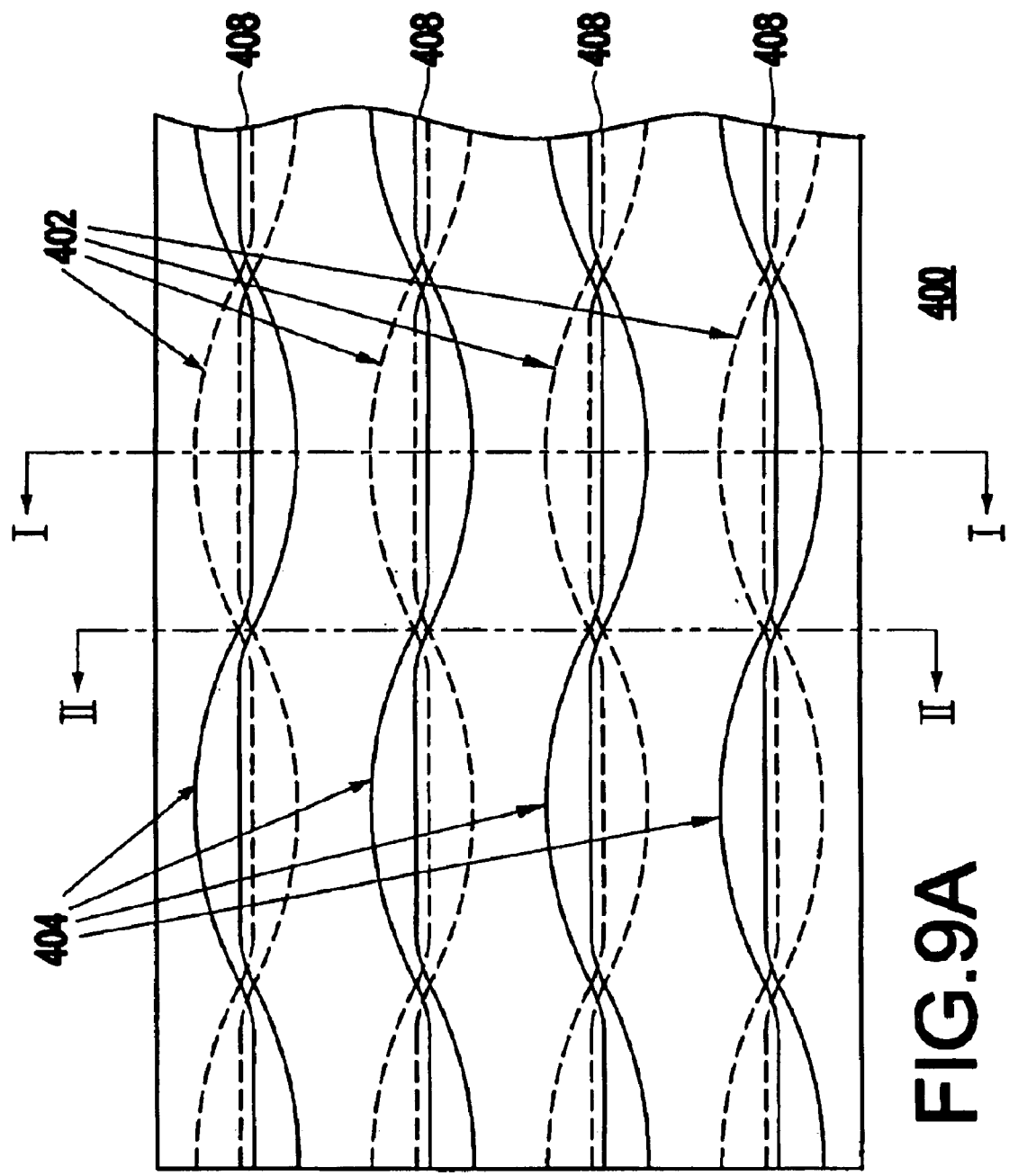

Referring again to the drawings, FIGS. 9A–9C illustrate a non-uniform transmission line 400 according to a fourth aspect of the present invention. In this aspect, (e.g., see FIGS. 9B–9C) the inventive non-uniform transmission line 400 includes at least one stack 410A–D (e.g., a plurality of stacks) of transmission groups 408 (e.g., each transmission group having a first patterned conductive layer 402 and a second patterned conductive layer 404).

More specifically, FIG. 9B illustrates a view along a cross-section I—I of a non-uniform transmission line 400, and FIG. 9C illustrates a view along cross-section II—II of a non-uniform transmission line 400. As shown in FIGS. 9B–9C, in this aspect, the inventive non-uniform transmission line 400 includes a dielectric layer(s) 403 between each of the patterned conductive layers 402, 404. The non-uniform transmission line 400 also includes a separating insulation layer 406 between each of the transmission groups 408. The separating insulating layer 406 may be formed of materials similar to that of the insulating layer 401, 405 and may have a range of thicknesses.

Further, although FIGS. 9A–9C show four stacks of transmission groups and four transmission groups per stack, this is certainly not intended to be limiting. In other words, the inventive non-uniform transmission line 400 may include any number of stacks and any number of transmission pairs per stack.

In addition, as in the second and third aspects, in this aspect, the patterned conductive layers 402, 404 may have virtually an unlimited number of patterns. Further, the patterned conductive layers 402, 404 may have different periods, or may have features which do not coincide along the length of the non-uniform transmission line 400.

Further, the transmission groups 408 may have different applications from each other. Moreover, in this aspect, the stacks 410A–D may have different applications from each other. That is, each transmission group in a stack may be dedicated for a same application, with the stacks having separate applications. For example, stack 410A may have several transmission groups 405, each of which may be used as a voice/data wire, whereas each of the transmission groups 405 in stack 410B may be used as a cable television wire, and so on.

Referring again to the drawings, FIGS. 10A–10C illustrate another aspect of a non-uniform transmission line according to the present invention. As shown in FIG. 10A, the non-uniform transmission line 500 may have at least one patterned conductive layer 502, 504 which may include, for example, a conductive layer which has a shape other than flat (e.g., round). In other words, the cross-section of the conductive layers 502, 504 in this aspect may have a shape other than rectangular (e.g., circular).

Specifically, FIG. 10A illustrates a top view of the non-uniform transmission line 500, FIG. 10B illustrates a view along cross-section I—I of the non-uniform transmission line 500, and FIG. 10C illustrates a view along cross-section II—II of the non-uniform transmission line 500.

The inventive non-uniform transmission line 500 may have features as discussed above with respect to the other aspects. For instance, the patterned conductive layers 502, 504 may have an unlimited number of patterns. Further, a dielectric layer 503 may be formed between the conductive layers 502, 504. In addition, an insulating layer (not shown) may be formed around the conductive layers 502, 504 and the dielectric layer 503.

Referring again to the drawings, FIGS. 11A–11G illustrate another aspect of the present invention. As shown in FIGS. 11A–11G, the inventive non-uniform transmission line may be formed of a single conductive layer. This single conductive layer may also be surrounded by an insulation layer similar to the insulation layer discussed above.

Further, this single conductive layer may be formed so as to have two portions which are coplanar. These two portions may be formed, for example, by creating a space (e.g., a gap) in the conductive layer near the midline of the conductive layer. These two portions may form a transmission group.

Figure 11A:
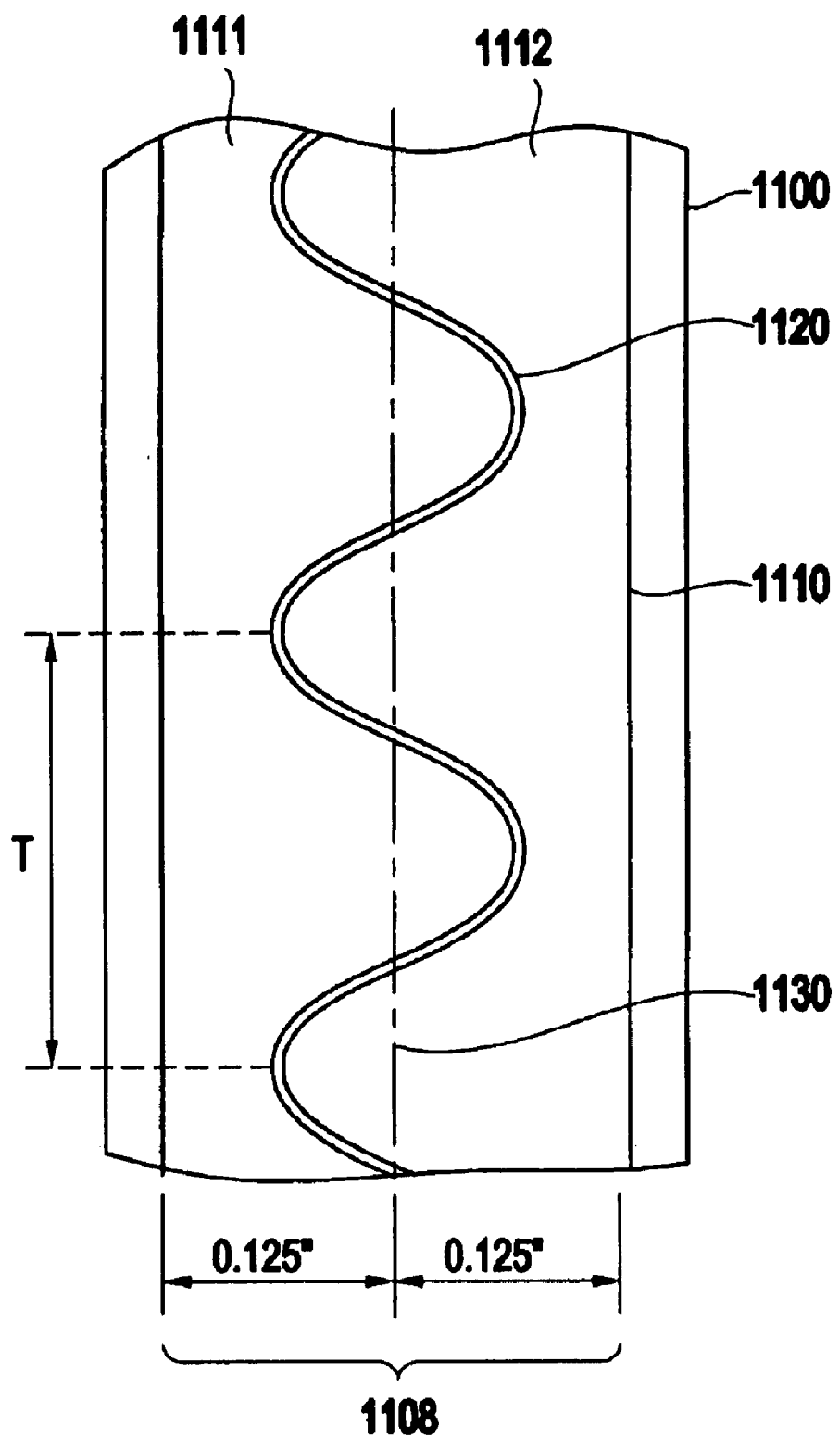
FIGS. 11A–11G illustrate a non-uniform transmission line having a single conductive layer which has two portions.
Figure 11D:
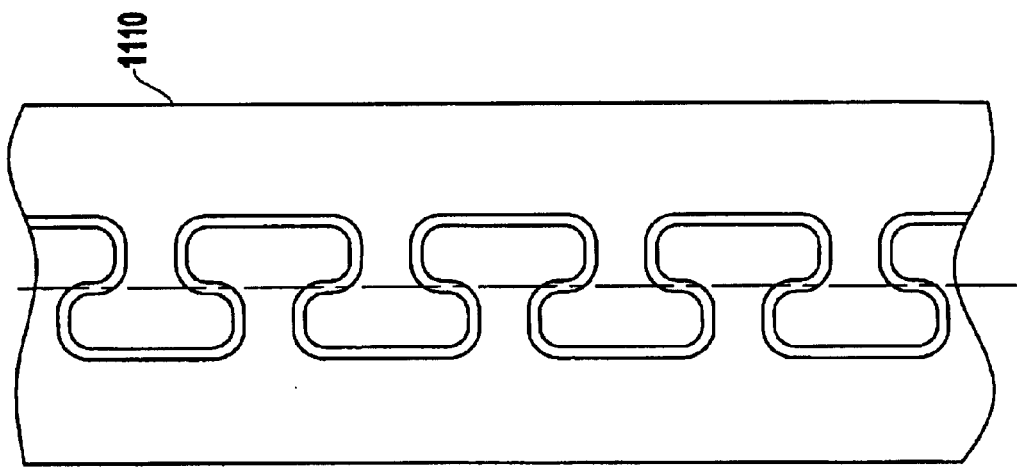
Figure 11C:
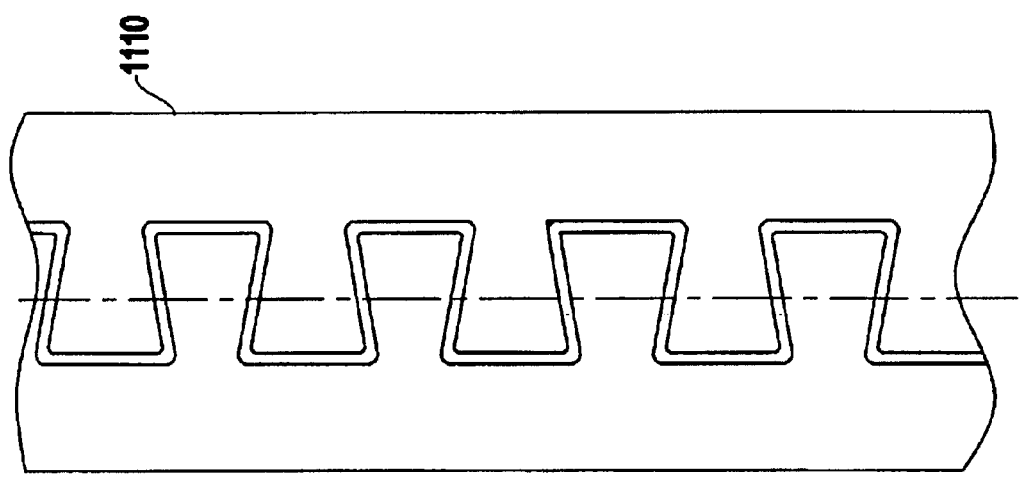
Figure 11B:
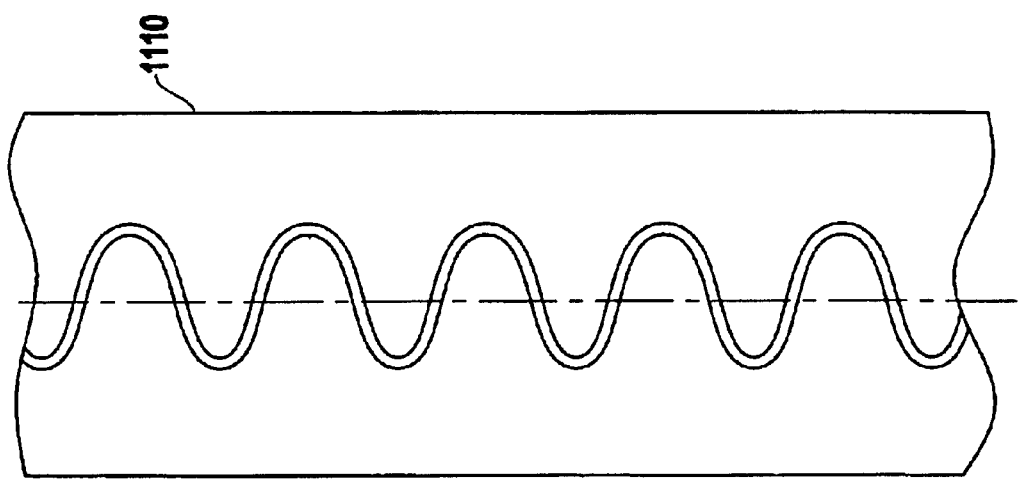
Figure 11E:
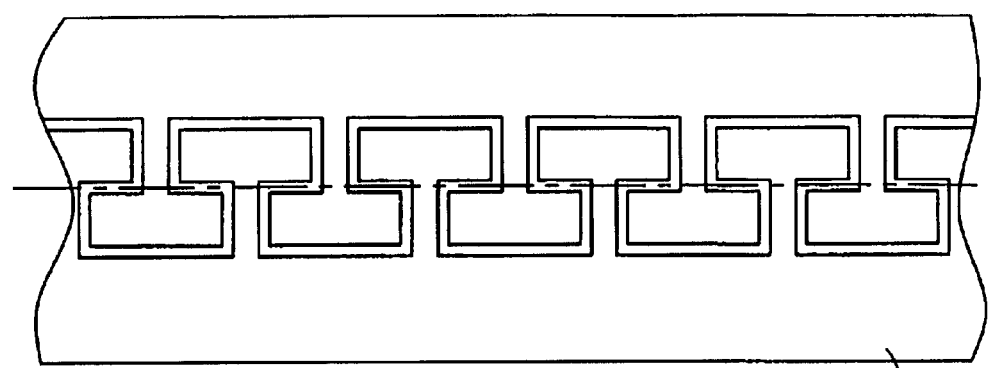
Figure 11F:
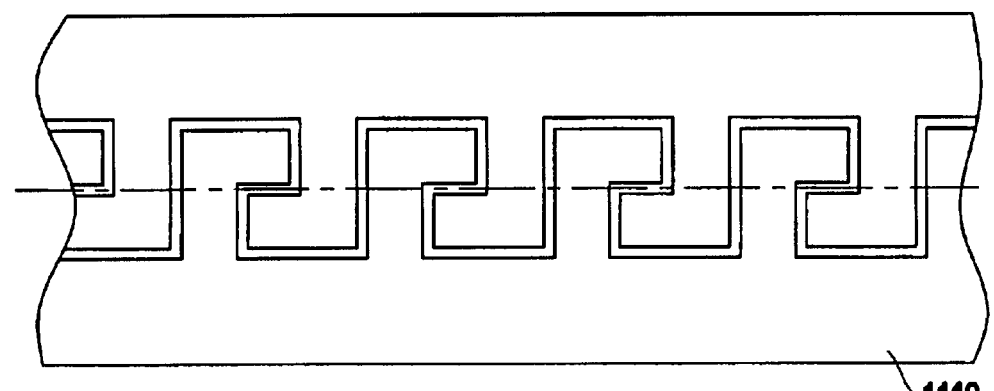

For example, FIG. 11A illustrates a non-uniform transmission line 1100 which has a conductive layer 1110 which is about 0.250 inches wide. Further, a sinusoidal line may be drawn along the midline 1130 of the conductive layer 1110. A gap 1120 (e.g., space) may be formed along the sinusoidal line so as form two portions 1111, 1112 of the conductive layer down the length of the non-uniform transmission line 1100. The line 1100 may, therefore, have a period, T, as shown in FIG. 11A. Further, the two portions 1111, 1112 may form a transmission group 1108.

It should be noted that the width of the gap (e.g., space) between the two portions may be adjusted to achieve a desired impedance (Z) for the non-uniform transmission line 1100. Further, the width of the gap may or may not be uniform (e.g., constant) along the length of the non-uniform transmission line 100. Further, the gap between the two portions 1111, 1112 of conductive layer 1110 may be filled with air or other dielectric material (e.g., a dielectric material as discussed above). Thus, the gap width or a filler (e.g., air) within the gap may be selectively changed so as to affect the electromagnetic properties of the non-uniform transmission line 1100.

Further, although a sinusoidal pattern is illustrated in FIG. 11A, this is merely exemplary and should not be considered as limiting in any way. For example, FIGS. 11B–11F provide examples of patterns that may be used in the non-uniform transmission line 1100. In other words, the number and types of patterns (e.g., sinusoidal, parabolic, sawtooth, square cut, T-shaped, L-shaped, etc.) that may be used in the inventive non-uniform transmission line are virtually limitless.

Figure 11G:
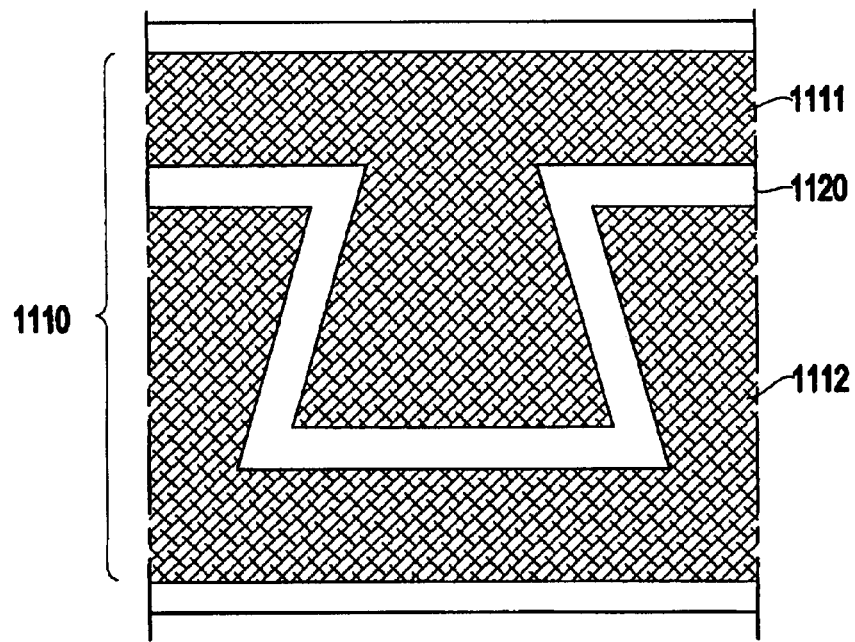

Further, FIG. 11G provides a detailed illustration of an example of an interface between two portions 1111, 1112 of a conductive layer 1110 in a non-uniform transmission line 1100. As shown in FIG. 11G, the two portions 1111, 1112 may be formed so that a capacitive coupling is maintained between the two portions 1111, 1112 in the event that the gap (e.g., space) between the two portions 1111, 1112 should become more or less than a design (e.g., original design), such as by bending or routing. This allows the inventive non-uniform transmission line 1100 to maintain electromagnetic properties even when the gap (e.g., spacing) width is altered.

Further, the inventive non-uniform transmission line may be used as an infrastructure wire easily and efficiently providing transmission mediums for any number of applications. For example, the inventive non-uniform transmission line may be bundled (e.g., packaged) so as to form a line bundle capable of handling multiple and diverse applications. For example, a bundle may include a non-uniform transmission line which are used to transmit signals (e.g., voice/data signals) over the world wide web (e.g., the Internet). The bundle may also include a non-uniform transmission line dedicated to a signal broadcast system or telecommunications system. Further, the bundle may include non-uniform transmission lines in addition to uniform transmission lines (e.g., round wires). In other words, the inventive non-uniform transmission line may act as a building bus for multiple applications requiring a variety of electrical signals.

Further, the performance of the inventive non-uniform transmission line (e.g., any aspect of the inventive non-uniform transmission line) may be accomplished by implementing appropriate conductive layer/insulative layer patterns. For example, placing such patterns at specific pitches (e.g., crossover frequencies), and adjusting the conductor plane (e.g., conductive layer) thickness and dielectric plane (e.g., dielectric layer) thickness may allow a transmission with a high signal integrity. These conductor/insulator patterns may require a uniform or non-uniform cross section along their length.

In short, electromagnetic characteristics, including impedance, dielectric characteristics and ultimately the signal integrity over the entire length of the non-uniform transmission line may be determined, for example, by the conductive layer pattern, frequency of pattern crossover (e.g., period), features defined along the length of non-uniform transmission line, conductive layer thickness, dielectric layer thickness and other geometrical features.

In addition, the patterned conductive layers and dielectric layers may be any shape in cross section but should be controlled within their respective planes to provide the necessary electromagnetic characteristics from a signal integrity standpoint. Features within individual patterns may be varied to provide an electrical relationship from one conducting layer/insulating layer on one plane to another conducting layer/insulating layer in the same plane, or in a different plane.

Since manipulation of any or all of these physical parameters affect the electromagnetic and/or mechanical characteristics, many different configurations are possible in the inventive non-uniform transmission line. For instance, more than two planes may exist per non-uniform transmission line. In addition, several non-uniform transmission lines (e.g., having different applications) may be formed in a bundle and spaced and/or staggered in a fashion that permits a higher level of performance than would otherwise be achievable under typical installation conditions such as bends, sags, and other routing effects. Furthermore, the advanced geometry and performance of the inventive non-uniform transmission line allows direct interconnect (e.g., bus interconnect) between nodes.

In addition, the inventive non-uniform transmission line may be formed of materials that provide proper operating conditions (e.g., electromagnetic and signal integrity characteristics) and may be varied to enhance those characteristics. For instance, dielectric layers (e.g., insulating layers) at specific thicknesses and tolerances may contribute to producing the desired electromagnetic and mechanical characteristics. Further, the non-uniform transmission line may be designed to provide the appropriate insulation characteristics and special requirements or constructions to provide strength, noise immunity, bundle integrity, and other requirements for the particular environment conditions for which it is intended.

Moreover, the inventive non-uniform transmission line is very robust and highly resistant to adverse conditions. This allows the non-uniform transmission line to be used for many other applications. For example, the non-uniform transmission line may be used in automobiles, aircraft, trains, etc. where a highly effective and efficient transmission medium is desired.

Moreover, the inventive non-uniform transmission line may provide a much faster transmission medium than any conventional medium. For example, the inventive conductor may include many transmission groups, each conductive layer transmitting a bit of data, so that many bits of data could be simultaneously transmitted.

Figure 12A:
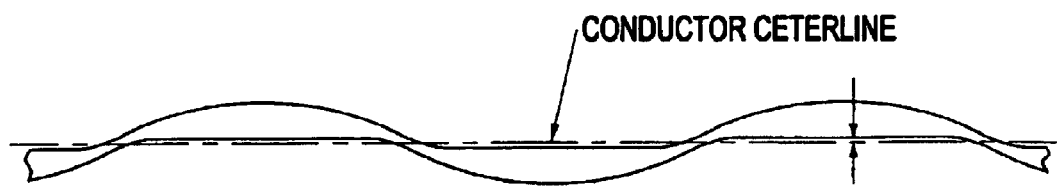
FIGS. 12A–12G illustrate some parameters that may be adjusted in order to affect the various signal transmission characteristics in the inventive non-uniform transmission line.
Figure 12B:
Figure 12C:
Figure 12D:
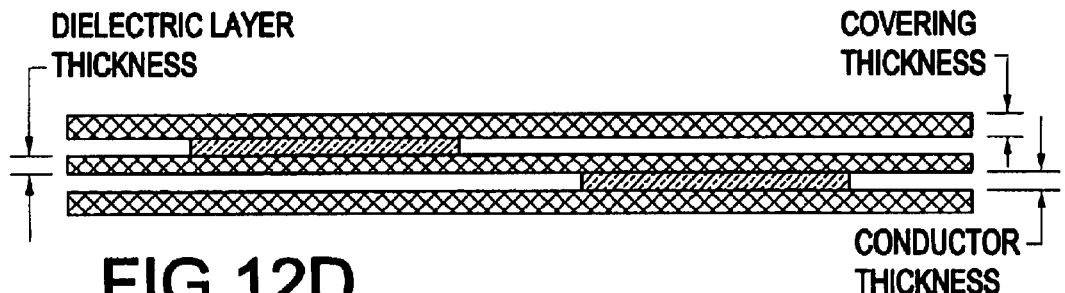
Figure 12E:
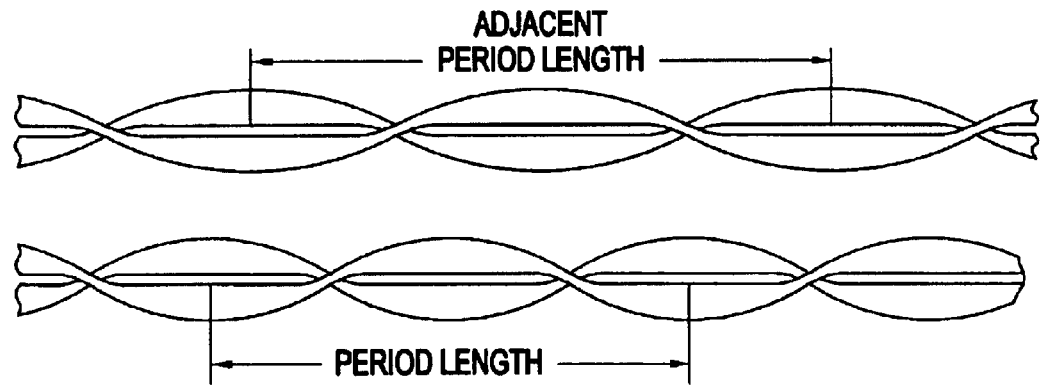
Figure 12F:
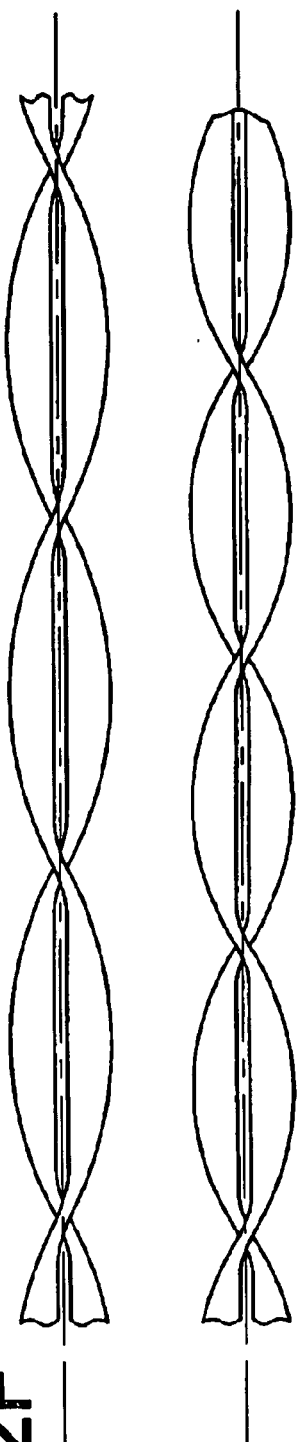
Figure 12G:
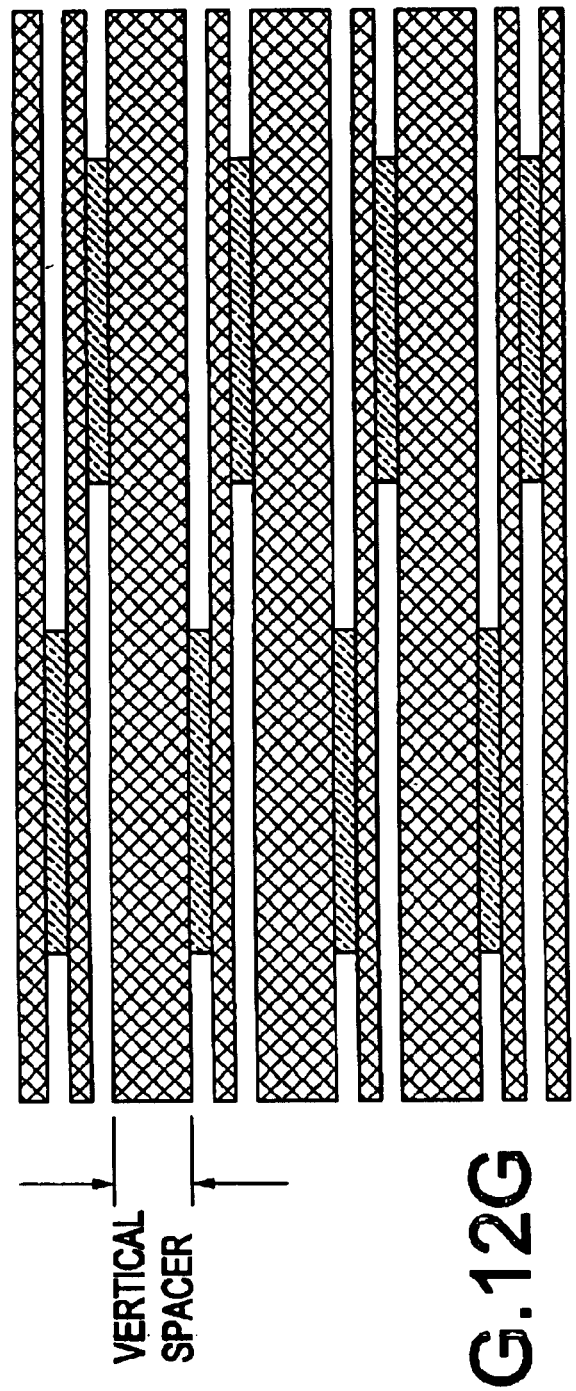

Referring again to the drawings, FIGS. 12A–12G illustrate some parameters that may be adjusted in order to affect the performance of the inventive non-uniform transmission line. Specifically, such parameters may include offset distance (FIG. 12A), capacitive area (e.g., the area of a conductive layer forming a capacitive relationship) (FIG. 12B), period length (FIG. 12C), conductive layer thickness, dielectric layer thickness, and insulating layer thickness (e.g., covering layer thickness) (FIG. 12D), adjacent period length (e.g., the period of a transmission group which is adjacent to the transmission group under examination) (FIG. 12E), pair spacing (e.g., horizontal spacing between two transmission groups) (FIG. 12F), and vertical spacer thickness (e.g., the vertical space between two transmission groups) (FIG. 12G).

Other parameters which may be varied to adjust the characteristics of the inventive non-uniform transmission line include, for example, dielectric constant of the dielectric layer, dielectric layer dissipation factor, conductive layer conductivity, insulating layer dielectric constant (e.g., covering layer dielectric constant), insulating layer dissipation factor and vertical spacer dielectric constant. Any of the above-referenced parameters, either alone or in combination, may be varied in order to provide the optimum performance for the desired application.

More specifically, FIG. 13 provides a parameter effects matrix which shows the general effects of making small incremental changes in some of the design parameters in a successful design of the inventive non-uniform transmission line. FIG. 13 shows how increases in various design parameters (e.g., offset distance, capacitive area, etc.) may affect impedance, attenuation, high frequency limit, cross talk, propagation delay, and overall signal integrity in the inventive non-uniform transmission line.

It should be noted that an effect provided in FIG. 13 may be considered a rule of thumb but may not be true in all cases and should not be considered as limiting the invention in any manner. For instances, large changes or combinations of changes and or certain material changes may have effects different from those outlined in the chart. The overall specific requirements may be achieved by the careful implementation and manipulation of all of the basic design parameters.

Further, as shown in FIG. 13, in some cases when a parameter is altered (e.g., increased) the effect on the characteristics of the inventive non-uniform transmission line may depend on other factors (e.g., the signal being transmitted), materials used (e.g., materials used in the conductive layer, dielectric layer, insulating layer, vertical spacer, etc.) or parameters (e.g., capacitive area, period length, etc.). For instance, as shown in FIG. 13, when an offset distance is increased, the attenuation may be increased or decreased, depending on the materials used in the non-uniform transmission line.

Figure 14:
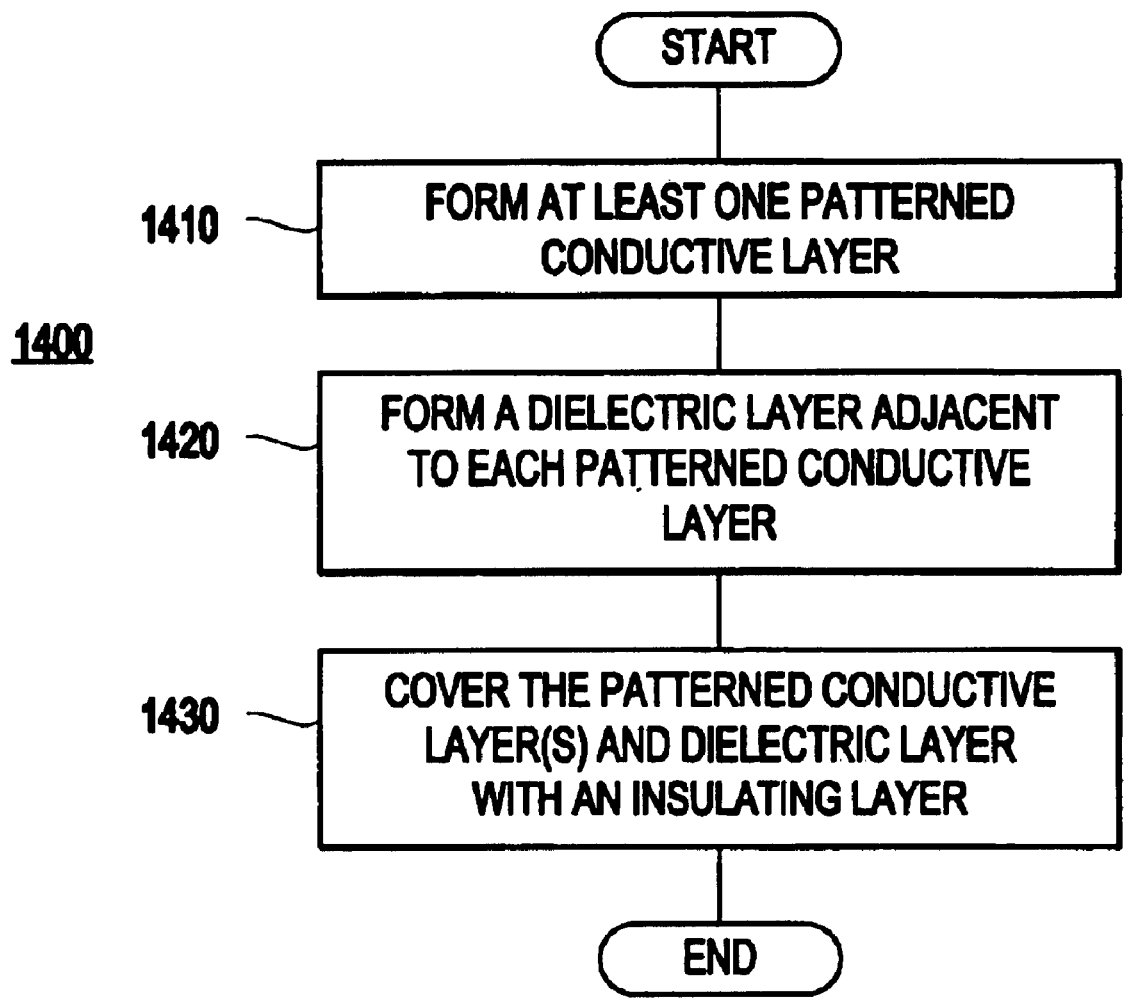
FIG. 14 is a flow diagram illustrating a method 600 of fabricating a non-uniform transmission line according to the present invention.

Referring again to the drawings, FIG. 14 is a flow diagram illustrating a method 1400 of fabricating a non-uniform transmission line according to the present invention. As shown in FIG. 14, the inventive method 1400 includes forming (1410) at least one patterned conductive layer, forming (1420) a dielectric layer adjacent each patterned conductive layers, and covering (1430) the at least one patterned conductive layer and the dielectric layer with an insulating layer.

The forming (1410) of the at least one patterned conductive layer may be performed in a variety of ways. For instance, the patterned conductive layers may be formed using a continuous process or a non-continuous process. More specifically, the patterned conductive layer may be formed by subjecting a layer of conductive material to a stamping (e.g., die cut/stamping), etching, screening, printing, or molding process. Further, the patterned conductive layer may be formed by a laser-cutting process, wafer cutting process, or wafer splitting process.

With its unique and novel features, the present invention provides a revolutionary, new and novel non-uniform transmission line which may be efficiently and effectively used to supply a high speed transmission medium in multiple and diverse applications.

While the invention has been described in terms of preferred embodiments, those skilled in the art will recognize that the invention can be practiced with modification within the spirit and scope of the appended claims. Specifically, the dimensions (e.g., thicknesses, dielectric constants, etc.) given herein should be considered as examples and should not be understood as limiting the invention in any regard. Further, it should be noted that although flat conductive layers are described in many places herein, certainly other shapes of conductive layers may be used. For example, a conductive layer having a round cross-section may be used. In such a case, a crossover node may be formed, for example, by stamping the round wire at the intended location of the node.

What is claimed is:

1. A non-uniform transmission line comprising:
    at least one patterned conductive layer comprising a curved portion;
    a dielectric layer adjacent to said each said at least one patterned conductive layer; and
    an insulating layer surrounding said at least one patterned conductive layer and said dielectric layer, so as to form said non-uniform transmission line.

2. The non-uniform transmission line according to claim 1, wherein a space between each patterned conductive layer is non-uniform along a length of said non-uniform transmission line.

3. The non-uniform transmission line according to claim 1, wherein said patterned conductive layer is non-uniform along a length of said non-uniform transmission line.

4. The non-uniform transmission line according to claim 1, wherein said dielectric layer is formed between each patterned conductive layer.

5. The non-uniform transmission line according to claim 1, wherein said dielectric layer comprises a plurality of dielectric layers.

6. The non-uniform transmission line according to claim 1, wherein said at least one patterned conductive layer comprises a plurality of patterned conductive layers having a multi-planar arrangement and comprising:
    a first conductive layer in a first horizontal plane; and
    a second conductive layer in a second horizontal plane.

7. The non-uniform transmission line according to claim 1, wherein said non-uniform transmission line comprises a flexible non-uniform transmission line.

8. The non-uniform transmission line according to claim 1, wherein, when said non-uniform transmission line is flexed, a separation distance is maintained between each said at least one patterned conductive layer.

9. The non-uniform transmission line according to claim 1, wherein said dielectric layer has a thickness of 0.00025 to 0.250 inches.

10. The non-uniform transmission line according to claim 1, wherein said dielectric layer has a dielectric constant of 1.0 to 10.0 and a dissipation factor of 0.1 to 0.000001.

11. The non-uniform transmission line according to claim 1, wherein said dielectric layer comprises a polymeric dielectric layer.

12. The non-uniform transmission line according to claim 1, wherein said dielectric layer comprises one of polypropylene, polyester, and polyethylene.

13. The non-uniform transmission line according to claim 1, wherein said dielectric layer comprises a patterned dielectric layer.

14. The non-uniform transmission line according to claim 1, wherein said dielectric layer comprises a plurality of dielectric layers.

15. The non-uniform transmission line according to claim 1, wherein said at least one patterned conductive layer has a non-uniform pattern within a given period.

16. The non-uniform transmission line according to claim 1, wherein each said at least one patterned conductive layer has a thickness of no more than about 0.1 inches.

17. The non-uniform transmission line according to claim 1, wherein said at least one patterned conductive layer comprises an electrically conductive layer.

18. The non-uniform transmission line according to claim 17, wherein said electrically conductive layer comprises at least one of a metal, polysilicon, ceramic, carbon fiber and conductive ink.

19. A signal broadcast system comprising at least one non-uniform transmission line according to claim 1.

20. A telecommunications system comprising at least one non-uniform transmission line according to claim 1.

21. An infrastructure bus system comprising at least one non-uniform transmission line according to claim 1.

22. The non-uniform transmission line according to claim 1, wherein said curved portion comprises a curved edge portion.

23. The non-uniform transmission line according to claim 1, wherein said curve-shaped portion comprises a wave-shaped portion.

24. The non-uniform transmission line according to claim 1, wherein said at least one patterned conductive layer comprises an edge having alternating curved portions and straight portions.

25. The non-uniform transmission line according to claim 1, wherein said patterned conductive layer comprises a straight portion having a non-uniform width.

26. The non-uniform transmission line according to claim 1, wherein said insulating layer comprises tapered sidewalls.

27. The non-uniform transmission line according to claim 1, wherein said non-uniform transmission line comprises a surface-mountable non-uniform transmission line.

28. A non-uniform transmission line, comprising:
    at least one transmission group, each said transmission group comprising at least one patterned conductive layer comprising a curved portion;
    a dielectric layer formed adjacent said at least one patterned conductive layer; and
    an insulating layer covering said at least one transmission group and said dielectric layer, so as to form said non-uniform transmission line.

29. The non-uniform transmission line according to claim 28, wherein a space between each patterned conductive layer in said at least one transmission group is non-uniform along a length of said non-uniform transmission line.

30. The non-uniform transmission line according to claim 28, wherein said at least one patterned conductive layer comprises a plurality of patterned conductive layers.

31. The non-uniform transmission line according to claim 30, wherein said dielectric layer is formed between each patterned conductive layer.

32. The non-uniform transmission line according to claim 28, wherein said at least one transmission group comprises a plurality of transmission groups.

33. The non-uniform transmission line according to claim 32, wherein said plurality of transmission groups are coplanar, and wherein a same dielectric layer is formed between patterned conductive layers of each transmission group.

34. The non-uniform transmission line according to claim 32, wherein said plurality of transmission groups are in separate planes so as to form a multi-planar arrangement, and wherein a separating insulating layer is formed between each transmission group.

35. The non-uniform transmission line according to claim 32, wherein said plurality of transmission groups comprises a range of 2 to 25 transmission groups.

36. The non-uniform transmission line according to claim 32, wherein a first transmission group has a crossover frequency which is different from a crossover frequency of a second transmission group.

37. The non-uniform transmission line according to claim 32, wherein said plurality of transmission groups comprises a first transmission group having a first application and a second transmission group having a second application, different from said first application.

38. The non-uniform transmission line according to claim 32, wherein said plurality of transmission groups comprises:
    a first set of transmission groups, each transmission group of said first set having a first patterned conductive layer in a first horizontal plane and a second patterned conductive layer in a second horizontal plane;
    a second se of transmission groups, each transmission group of said second set having a first patterned conductive layer in a third horizontal plane and a second patterned conductive layer in a fourth horizontal plane; and
    a separating insulating layer formed between said first and second sets of transmission groups,
    wherein a same dielectric layer is formed between patterned conductive layers in said first set of transmission groups, and a same dielectric layer is formed between patterned conductive layers in said second set of transmission groups.

39. The non-uniform transmission line according to claim 32, wherein a period of one transmission group does not coincide with a period of another transmission group.

40. A non-uniform transmission line comprising:
    a plurality of transmission groups formed as a stack, each transmission group comprising first and second patterned conductive layers which comprise a curved portion;
    a dielectric layer formed between said first and second patterned conductive layers;
    a separating insulating layer formed between each of said transmission groups; and
    an outer insulating layer covering said plurality of transmission groups, said dielectric layer and said separating insulating layer, so as to form said non-uniform transmission line.

41. The non-uniform transmission line according to claim 40, wherein said stack comprises a plurality of stacks, each of said stacks comprising a plurality of transmission groups formed in separate horizontal planes.

42. The non-uniform transmission line according to claim 41, wherein said plurality of stacks comprises a first stack of transmission groups having a first application, and a second stack of transmission groups having a second application, different from that of said first application.

43. A non-uniform transmission line, comprising:
    a patterned conductive layer comprising a curved portion and comprising first and second portions which are separated by a predetermined distance; and
    an insulating layer surrounding said patterned conductive layer, so as to form said non-uniform transmission line.

44. The non-uniform transmission line according to claim 43, wherein each of said first and second portions of said patterned conductive layer has a non-uniform width along a length of said non-uniform transmission line.

45. The non-uniform transmission line according to claim 43, wherein said first and second portions have an interweaving arrangement.

46. The non-uniform transmission line according to claim 43, wherein said first and second portions have an interlocking arrangement.

47. The non-uniform transmission line according to claim 43, wherein said patterned conductive layer has a width of 0.25 inches or more.

48. A method of fabricating a non-uniform transmission line, comprising:
    forming at least one patterned conductive layer comprising a curved portion;
    forming a dielectric layer adjacent to each said at least one patterned conductive layer; and
    covering said at least one patterned conductive layer and said dielectric layer with an insulating layer, so as to form said non-uniform transmission line.

49. The method according to claim 48, wherein said forming at least one patterned conductive layer comprises one of a stamping process, an etching process, a screening process, and a molding process.

50. The method according to claim 48, wherein said forming at least one patterned conductive layer comprises one of a laser cutting process, a wafer cutting process, and a wafer splitting process.

51. A bundled transmission line, comprising:
    at least one non-uniform transmission line comprising:
        at least one patterned conductive layer comprising a curved portion;
        a dielectric layer formed adjacent to said at least one patterned conductive layer; and
        an insulating layer surrounding said at least one patterned conductive layer and said dielectric layer, so as to form said non-uniform transmission line.

52. The bundled transmission line according to claim 51, further comprising:
    at least one uniform transmission line bundled with said non-uniform transmission line.

* * * * *